United States Patent [19]
Hong

[11] Patent Number: 6,147,551
[45] Date of Patent: Nov. 14, 2000

[54] SWITCHED CAPACITOR CIRCUIT AND METHOD FOR REDUCING SAMPLING NOISE

[75] Inventor: Merit Y. Hong, Chandler, Ariz.

[73] Assignee: Motorola, Inc., Schaumburg, Ill.

[21] Appl. No.: 09/002,789

[22] Filed: Jan. 5, 1998

[51] Int. Cl.[7] .............................. G11C 27/02; H03K 5/00
[52] U.S. Cl. ............................................. 327/554; 327/91
[58] Field of Search ................................ 327/554, 91, 93, 327/94, 95, 96, 390; 330/9; 341/122

[56] References Cited

U.S. PATENT DOCUMENTS

| | | | |
|---|---|---|---|
| 4,331,894 | 5/1982 | Gregorian et al. | 327/554 |
| 4,604,584 | 8/1986 | Kelly | 307/355 |
| 4,894,620 | 1/1990 | Nagaraj | 327/554 |
| 4,988,900 | 1/1991 | Fensch | 327/554 |
| 5,065,157 | 11/1991 | Ribner et al. | 341/143 |
| 5,103,230 | 4/1992 | Kalthoff et al. | 341/166 |
| 5,144,160 | 9/1992 | Lee et al. | 327/94 |
| 5,162,801 | 11/1992 | Powell et al. | 341/150 |
| 5,182,521 | 1/1993 | Chang et al. | 328/167 |
| 5,514,997 | 5/1996 | Quinn | 327/554 |
| 5,608,401 | 3/1997 | Viswanathan et al. | 341/144 |
| 5,680,072 | 10/1997 | Vulih et al. | 327/554 |
| 5,736,895 | 4/1998 | Yu et al. | 327/554 |

FOREIGN PATENT DOCUMENTS

| | | |
|---|---|---|
| 0010014 | 4/1980 | European Pat. Off. . |
| 8103589 | 12/1981 | WIPO . |

*Primary Examiner*—My-Trang Nu Ton
*Attorney, Agent, or Firm*—Lanny L. Parker

[57] ABSTRACT

A switched capacitor circuit (60) reduces sampling noise by oversampling an input signal in space domain. The switched capacitor circuit (60) includes four sampling capacitors (72, 74, 76, 78) serially coupled together via five integrating switches (71, 73, 75, 77, 79). Each clock cycle of the oversampling process has a sampling phase and an integrating phase. In the sampling phase, the integrating switches (71, 73, 75, 77, 79) are nonconductive and the sampling capacitors (72, 74, 76, 78) sample the input signal through eight sampling switches (81, 82, 83, 84, 85, 86, 87, 88). In the integrating phase, the charge stored in the sampling capacitors (72, 74, 76, 78) is transferred to an integrator (90).

21 Claims, 6 Drawing Sheets

SWITCHED CAPACITOR CIRCUIT AND METHOD FOR REDUCING SAMPLING NOISE

BACKGROUND OF THE INVENTION

The present invention relates, in general, to signal processing circuits and, more particularly, to switched capacitor circuits.

Switched capacitor circuits are widely used in signal processing applications such as, for example, filtering, analog to digital converting, digital to analog converting, or the like. An effect that degrades the performance of a switched capacitor circuit is the sampling noise. Using small capacitors in a switched capacitor circuit improves the power efficiency and high frequency performance of the switched capacitor circuit. However, the magnitude of the sampling noise is substantially proportional to the temperature and inversely proportional to the capacitance values of the sampling capacitors in the switched capacitor circuit. Therefore, small capacitors exhibit large sampling noise.

The sampling noise can be reduced by sampling an input signal at a higher frequency than that of the input signal, i.e., oversampling the input signal in the time domain. For example, the input signal can be sampled at a frequency higher than the Nyquist frequency of the input signal by a factor of two, three, four, five, etc. The ratio of the sampling frequency to the Nyquist frequency of the input signal is conventionally referred to as the sampling rate (x). When the sampling rate is greater than one, the sampling is referred to as oversampling. For a bandwidth limited signal, the sampling noise is substantially inversely proportional to the sampling rate. Thus, sampling an input signal at a rate of four, i.e., 4×oversampling, reduces the sampling noise approximately by a factor of four compared with sampling the input signal a rate of one, i.e., 1×sampling. However, oversampling in the time domain increase the power consumption of the circuit. Further, the sampling rate has an upper limit determined by the high frequency characteristics of the devices in the circuit.

Accordingly, it would be advantageous to have a switched capacitor circuit and a method for reducing sampling noise therein. It is desirable for the circuit to be simple. It is also desirable for the circuit and the method to be power efficient. It would be of further advantage for the circuit and the method to be suitable for use in high frequency applications.

DETAILED DESCRIPTION OF THE DRAWINGS

Generally, the present invention provides a switched capacitor circuit and a method for reducing sampling noise therein. In accordance with the present invention, the reduction of sampling noise is achieved by oversampling a signal in the space domain.

Figure 1:
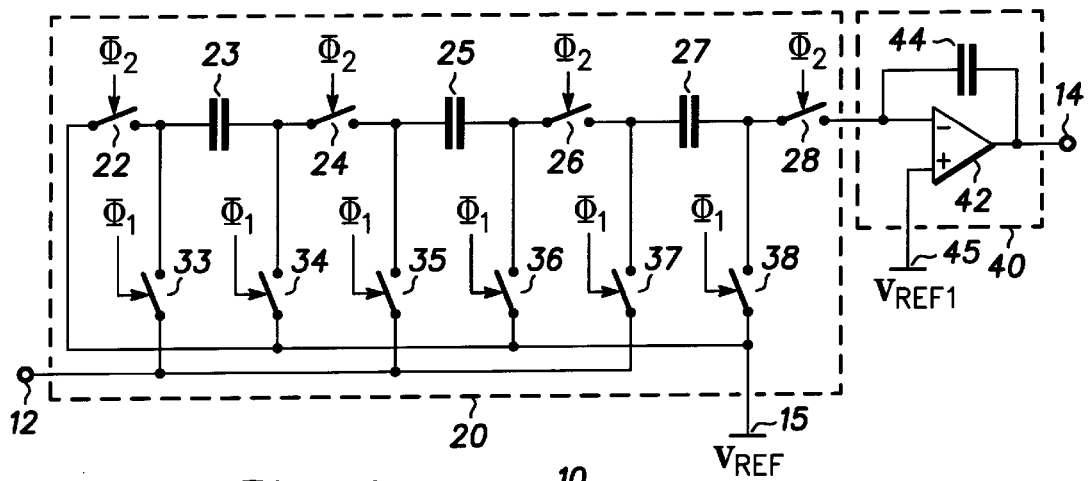
FIG. 1 is a schematic diagram of a switched capacitor circuit in accordance with a first embodiment of the present invention.

FIG. 1 is a schematic diagram of a switched capacitor circuit 10 in accordance with a first embodiment of the present invention. Switched capacitor circuit 10 is coupled for receiving an input signal at an input terminal 12 and coupled for transmitting an output signal at an output terminal 14. A reference voltage $V_{REF}$, e.g., ground voltage, is supplied to switched capacitor circuit 10 via a voltage supply conductor 15. Internally, switched capacitor circuit 10 includes a sampler 20 and an integrator 40.

Sampler 20 includes sampling capacitors 23, 25, and 27. Preferably, the capacitance values of capacitors 23, 25, and 27 are substantially equal to each other. Sampler 20 also includes switches 22, 24, 26, 28, 33, 34, 35, 36, 37, and 38, each having a control electrode and two current conducting electrodes. Devices that can be used as switches 22, 24, 26, 28, 33, 34, 35, 36, 37, and 38 in sampler 20 include insulated gate field effect transistors (IGFETs), metal semiconductor field effect transistors (MESFETs), bipolar transistors, insulated gate bipolar transistors, and the like. It should be noted that switches 22, 24, 26, 28, 33, 34, 35, 36, 37, and 38 can be comprised of a single type of device, e.g., n-channel IGFETs, or a combination of several types of devices. When using a field effect transistor (FET) as a switch, those skilled in the art are aware that a gate electrode of the FET functions as the control electrode of the switch, and source and drain electrodes of the FET function as the current conducting electrodes of the switch. When using bipolar transistor as a switch, those skilled in the art are aware that a base electrode of the bipolar transistor functions as the control electrode of the switch, and emitter and collector electrodes of the bipolar transistor function as the current conducting electrodes of the switch.

A first electrode of capacitor 23 is coupled to the conductor 15 via switch 22 and to input terminal 12 via switch 33. A second electrode of capacitor 23 is coupled to a first electrode of capacitor 25 via switch 24 and to conductor 15 via switch 34. The first electrode of capacitor 25 is also coupled to input terminal 12 via switch 35. A second electrode of capacitor 25 is coupled to a first electrode of capacitor 27 via switch 26 and to conductor 15 via switch 36. The first electrode of capacitor 27 is also coupled to input terminal 12 via switch 37. A second electrode of capacitor 27 is coupled for transmitting a sampled signal of sampler 20 via switch 28 and to conductor 15 via switch 38. The control electrodes of switches 33, 34, 35, 36, 37, and 38 are coupled for receiving a first clock signal $\Phi_1$. The control electrodes of switches 22, 24, 26, and 28 are coupled for receiving a second clock signal $\Phi_2$.

As described hereinafter, switches 33, 34, 35, 36, 37, and 38 are conductive during a sampling phase. Therefore, the first clock signal $\Phi_1$ applied to the control electrodes thereof is also referred to as a sampling signal. On the other hand, switches 22, 24, 26, and 28 are conductive during an integrating phase. Therefore, the second clock signal $\Phi_2$ applied to the control electrodes thereof is also referred to as an integrating signal. It should be noted that sampling signal $\Phi_1$ can be a voltage signal, a current signal, etc., depending on what types of devices switches 33, 34, 35, 36, 37, and 38 are. Likewise, integrating signal $\Phi_2$ can be a voltage signal, a current signal, etc., depending on what types of devices switches 22, 24, 26, and 28 are.

Integrator 40 includes an operational amplifier 42 and an integrating capacitor 44. Operational amplifier 42 has a noninverting input connected to a conductor 45 for receiving a reference voltage $V_{REF1}$, and an inverting input coupled to the second electrode of capacitor 27 via switch 28 for receiving the sampled signal of sampler 20. The reference voltage $V_{REF1}$ at conductor 45 can be equal to or different from the reference voltage $V_{REF}$ at conductor 15. An output of operational amplifier 42 is connected to output terminal 14 of switched capacitor circuit 10. Capacitor 44 is coupled between the inverting input and the output of operational amplifier 42.

In operation, switched capacitor circuit 10 samples the input signal at input terminal 12, integrates the input signal, and transmits the integrated signal to output terminal 14. In a clock cycle, each of sampling capacitors 23, 25, and 27 samples the input signal during the sampling phase. The sampled signal is transferred to integrator 40 during the integrating phase following the sampling phase. During the sampling phase, each of capacitors 23, 25, and 27 in switched capacitor circuit 10 samples the input signal once. Thus, switched capacitor circuit 10 performs a 3×oversampling and improves the signal to noise ratio substantially by a factor of three. Switches 33, 34, 35, 36, 37, and 38 are conductive during the sampling phase and nonconductive during the integrating phase. Therefore, they are also referred to as sampling switches. On the other hand, switches 22, 24, 26, and 28 are nonconductive during the sampling phase and conductive during the integrating phase. Therefore, they are also referred to as integrating switches. Switches 22, 24, 26, and 28 are serially coupled with capacitors 23, 25, and 27 to form an arrangement or a pattern of alternating integrating switches and sampling capacitors. Switches 22 and 28 are located at two endpoints of the arrangement and, therefore, are also referred to as endpoint switches.

It should be understood that the structure of switched capacitor circuit 10 is not limited to being that shown in FIG. 1. For example, in an alternative embodiment, switched capacitor circuit 10 is coupled for receiving a differential input signal. In such an embodiment, instead of being coupled to conductor 15, the second electrodes of capacitors 23, 25, and 27 are coupled for receiving one component of the differential input signal via switches 34, 36, and 38, respectively. The other component of the differential input signal is applied to input terminal 12. In another alternative embodiment, the second electrodes of capacitors 23, 25, and 27 are coupled via switches 34, 36, and 38, respectively, for receiving a feedback signal generated by a feedback circuit (not shown) coupled to the output of integrator 40. Further, switched capacitor circuit 10 is not limited to having three sampling capacitors, i.e., capacitors 23, 25, and 27. In accordance with the present invention, switched capacitor circuit 10 can have any plural number, e.g., two, four, five, six, etc., of sampling capacitors coupled to each other via switches. Generally, the sampling rate of switched capacitor circuit 10 is equal to the number of sampling capacitors therein.

Figure 2:
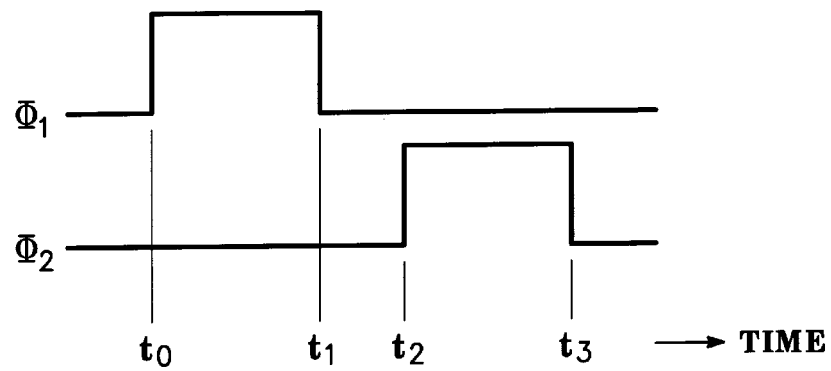
FIG. 2 is a timing diagram of signals applied to a switched capacitor circuit during an oversampling process in accordance with the present invention.

FIG. 2 is a timing diagram 50 of sampling signal $\Phi_1$ and integrating signal $\Phi_2$ applied to switched capacitor circuit 10 of FIG. 1 in an oversampling process in accordance with the present invention. FIG. 2 shows one clock cycle in the oversampling process that includes one sampling phase and one integrating phase. It should be noted that FIG. 2 intends to show a timing relation of the states of sampling switches 33, 34, 35, 36, 37, and 38, and integrating switches 22, 24, 26, and 28. For example, by depicting sampling signal $\Phi_1$ at a high level and integrating signal $\Phi_2$ at a low level between a time $t_0$ and a time $t_1$, FIG. 2 intends to show that sampling switches 33, 34, 35, 36, 37, and 38 are conductive and integrating switches 22, 24, 26, and 28 are nonconductive in a time interval between time $t_0$ and time $t_1$. As described hereinbefore, clock signals $\Phi_1$ and $\Phi_2$ can be voltage signals, current signals, etc. It should be noted that the signals applied to the control electrodes of the sampling switches are not limited to being identical to each other. For example, if switches 33, 34, and 35 are an NPN bipolar transistor, a p-channel FET, and an n-channel FET, respectively, the signals applied to the control electrodes of switches 33, 34, and 35 are a current signal, a low voltage signal, and a high voltage signal, respectively, between time $t_0$ and time $t_1$. Further, if a sampling switch, e.g., switch 36, includes a two-transistor pass gate comprised of a p-channel FET and an n-channel FET, the signal applied to the sampling switch should include a low voltage signal to the gate of the p-channel FET and a high voltage signal to the gate of the n-channel FET in order to switch on the sampling switch. Likewise, the signals applied to the control electrodes of the integrating switches are not limited to being identical to each other.

The sampling phase starts at time $t_0$ when sampling signal $\Phi_1$ switches to a high level and integrating signal $\Phi_2$ is at a low level. Switches 22, 24, 26, and 28 are nonconductive and capacitors 23, 25, and 27 are electrically isolated from each other. Switches 33, 34, 35, 36, 37, and 38 are switched on and conductive. Capacitor 23 is coupled between input terminal 12 and conductor 15 via switches 33 and 34, respectively. The input signal $V_{in}$ is applied across capacitor 23. Similarly, capacitor 25 is coupled between input terminal 12 and conductor 15 via switches 35 and 36, respectively, and the input signal $V_{in}$ is applied across capacitor 25. Further, capacitor 27 is coupled between input terminal 12 and conductor 15 via switches 37 and 38, respectively, and the input signal $V_{in}$ is applied across capacitor 27. The input signal $V_{in}$ charges sampling capacitors 23, 25, and 27. Thus, each of sampling capacitors 23, 25, and 27 samples the input signal. The charge stored in each of capacitors 23, 25, and 27 is substantially equal to the input signal voltage $V_{in}$ multiplied by the capacitance of each of capacitors 23, 25, and 27.

At time $t_1$, sampling signal $\Phi_1$ switches to a low level and integrating signal $\Phi_2$ remains at the low level. Switches 22, 24, 26, and 28 remain nonconductive. Switches 33, 34, 35, 36, 37, and 38 are switched off, decoupling capacitors 23, 25, and 27 from input terminal 12 and conductor 15, thereby terminating the sampling phase. Capacitors 23, 25, and 27 are electrically isolated from each other and from applied voltage signals.

The integrating phase starts at a time $t_2$ when sampling signal $\Phi_1$ remains at the low level and integrating signal $\Phi_2$ switches to a high level. Switches 33, 34, 35, 36, 37, and 38 remain nonconductive. Switches 22, 24, 26, and 28 are switched on and conductive. Capacitors 23, 25, and 27 are serially coupled between conductor 15 and the inverting input of operational amplifier 42. Immediately after time $t_2$, the voltage at the inverting input of operational amplifier 42 is temporarily substantially equal to negative three times the sampled input signal voltage $V_{in}$ ($-3V_{in}$) if $V_{REF1}$ is substantially equal to $V_{REF}$. Otherwise, there is a direct current (DC) voltage offset in the voltage at the inverting input of operational amplifier 42. Subsequently, operational amplifier 42 drives the voltage at its inverting input to the reference voltage $V_{REF1}$ at conductor 45, causing the charge stored in sampling capacitors 23, 25, and 27 to be transferred to integrating capacitor 44. It should be noted that the charge transferred to capacitor 44 is added to the charge that may already reside on capacitor 44 before time $t_2$.

At a time $t_3$, sampling signal $\Phi_1$ remains at the low level and integrating signal $\Phi_2$ switches to a low level. Switches 33, 34, 35, 36, 37, and 38 remain nonconductive. Switches 22, 24, 26, and 28 are switched off, terminating the integrating phase and the current clock cycle. Capacitors 23, 25, and 27 are electrically isolated from each other and from applied voltage signals. Switched capacitor circuit 10 is ready to sample the input signal at input terminal 12 in the next clock cycle.

Because capacitors 23, 25, and 27 are serially coupled between conductor 15 and the inverting input of operational amplifier 42 in the integrating phase, the amount of charge transferred to integrating capacitor 44 is substantially equal to the average of the charges stored in capacitors 23, 25, and 27 before time $t_2$. Thus, the charge transferred to integrating capacitor 44 represents an average value of the three samples of the input signal sampled by capacitors 23, 25, and 27. Therefore, switched capacitor circuit 10 performs a 3×oversampling of the input signal at input terminal 12. The 3×oversampling effectively reduces the sampling noise of switched capacitor circuit 10 by a factor of three. In a prior art switched capacitor circuit that has only one sampling circuit in place of sampling capacitors 23, 25, and 27, the sampling noise reduction is achieved by sampling the input signal at a higher frequency. Switched capacitor circuit 10 uses three sampling capacitors 23, 25, and 27 to oversample the input signal without increasing the sampling frequency. This oversampling scheme is referred to as oversampling in the space domain.

Figure 3:
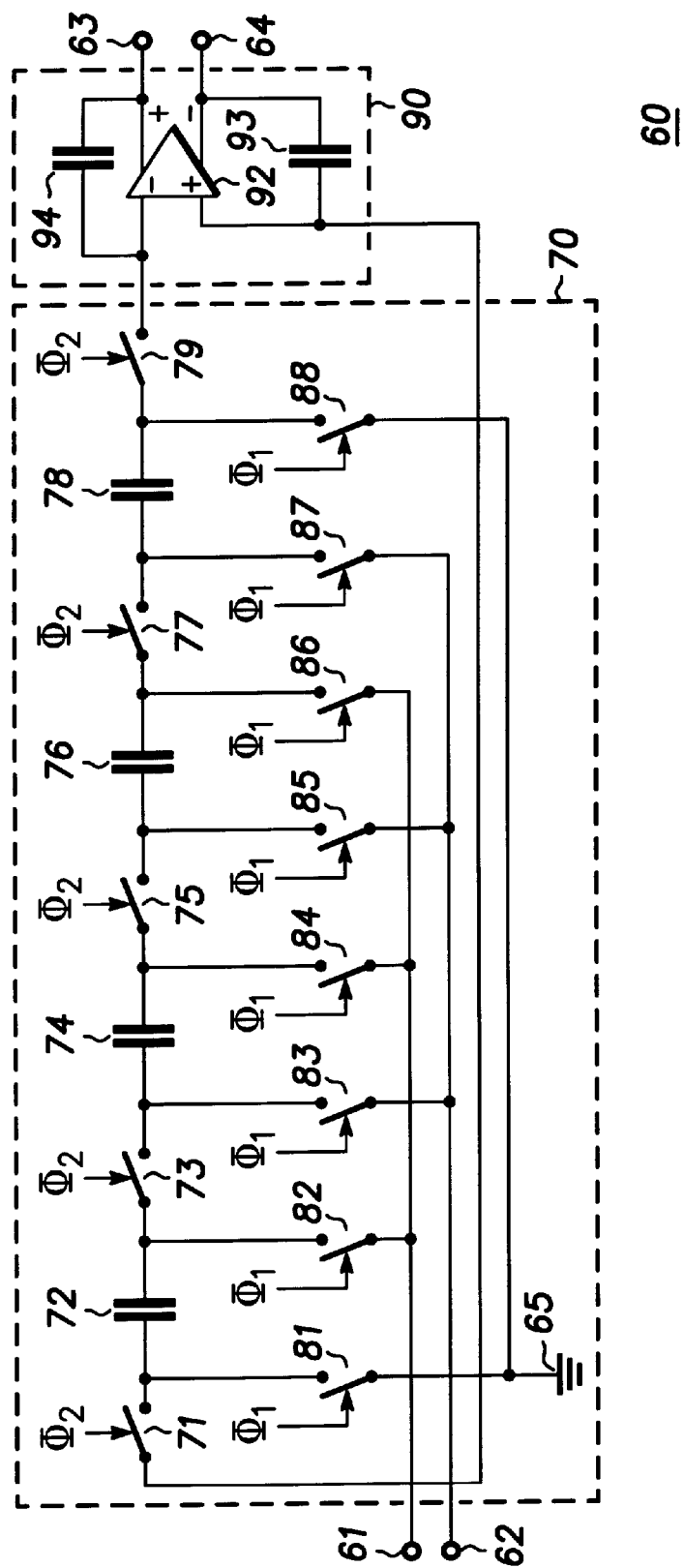
FIGS. 3–7 are schematic diagrams of switched capacitor circuits in accordance with alternative embodiments of the present invention.

FIG. 3 is a schematic diagram of a switched capacitor circuit 60 in accordance with a second embodiment of the present invention. Switched capacitor circuit 60 is coupled for receiving a differential input signal via a pair of input terminals 61 and 62, and coupled for transmitting a differential output signal via a pair of output terminals 63 and 64. A reference signal such as, for example, ground voltage is supplied to switched capacitor circuit 60 via a voltage supply conductor 65. Internally, switched capacitor circuit 60 includes a sampler 70 and an integrator 90.

Sampler 70 includes sampling capacitors 72, 74, 76, and 78. Preferably, the capacitance values of capacitors 72, 74, 76, and 78 are substantially equal to each other. Sampler 70 also includes switches 71, 73, 75, 77, 79, 81, 82, 83, 84, 85, 86, 87, and 88, each having a control electrode and two current conducting electrodes. Like switches 22, 24, 26, and 28 of switched capacitor circuit 10 shown in FIG. 1, switches 71, 73, 75, 77, and 79 are also referred to as integrating switches. Switches 71, 73, 75, 77, and 79 are serially coupled with capacitors 72, 74, 76, and 78 to form an arrangement or a pattern of alternating integrating switches and sampling capacitors. Like switches 33, 34, 35, 36, 37, and 38 of switched capacitor circuit 10 shown in FIG. 1, switches 81, 82, 83, 84, 85, 86, 87, and 88 are also referred to as sampling switches. Devices that can be used as switches 71, 73, 75, 77, 79, 81, 82, 83, 84, 85, 86, 87, and 88 in sampler 70 include IGFETs, MESFETs, bipolar transistors, insulated gate bipolar transistors, and the like.

A first electrode of capacitor 72 is coupled to conductor 65 via switch 81. A second electrode of capacitor 72 is coupled to a first electrode of capacitor 74 via switch 73 and to input terminal 61 via switch 82. The first electrode of capacitor 74 is also coupled to input terminal 62 via switch 83. A second electrode of capacitor 74 is coupled to a first electrode of capacitor 76 via switch 75 and to input terminal 61 via switch 84. The first electrode of capacitor 76 is also coupled to input terminal 62 via switch 85. A second electrode of capacitor 76 is coupled to a first electrode of capacitor 78 via switch 77 and to input terminal 61 via switch 86. The first electrode of capacitor 78 is also coupled to input terminal 62 via switch 87. A second electrode of capacitor 78 is coupled to conductor 65 via switch 88. The control electrodes of switches 81, 82, 83, 84, 85, 86, 87, and 88 are coupled for receiving a sampling signal $\Phi_1$ The control electrodes of switches 71, 73, 75, 77, and 79 are coupled for receiving an integrating signal $\Phi_2$.

Integrator 90 includes an operational amplifier 92 and integrating capacitors 93 and 94. Preferably, the capacitance values of integrating capacitors 93 and 94 are substantially equal to each other. Operational amplifier 92 has a noninverting input coupled to the first electrode of capacitor 72 via switch 71, an inverting input coupled to the second electrode of capacitor 78 via switch 79, a noninverting output connected to output terminal 63, and an inverting output connected to output terminal 64. Capacitor 93 has one electrode connected to the noninverting input of operational amplifier 92 and another electrode connected to the inverting output of operational amplifier 92. Capacitor 94 has one electrode connected to the inverting input of operational amplifier 92 and another electrode connected to the noninverting output of operational amplifier 92.

It should be understood that the structure of switched capacitor circuit 60 is not limited to being that shown in FIG. 3. For example, in an alternative embodiment, switched capacitor circuit 60 is coupled for receiving a single-ended input signal applied to the second electrodes of capacitors 72, 74, and 76 via switches 82, 84, and 86, respectively, and the first electrodes of capacitors 74, 76, and 78 are coupled via switches 83, 85, and 87, respectively, to receive a feedback signal generated by a feedback circuit (not shown) coupled to the outputs of integrator 90. Further, switched capacitor circuit 60 is not limited to having four sampling capacitors, i.e., capacitors 72, 74, 76, and 78. In accordance with the present invention, the number of sampling capacitors in switched capacitor circuit 60 can be any plural number, e.g., two, three, five, six, seven, etc.

In operation, switched capacitor circuit 60 samples the differential input signal at input terminals 61 and 62, integrates the differential input signal, and transmits the integrated signal to output terminals 63 and 64. Switched capacitor circuit 60 can operate on sampling signal $\Phi_1$ and integrating signal $\Phi_2$ shown in timing diagram 50 of FIG. 2. As mentioned hereinbefore, FIG. 2 shows one clock cycle that includes a sampling phase and an integrating phase.

The sampling phase starts at time $t_0$ when sampling signal $\Phi_1$ switches to a high level and integrating signal $\Phi_2$ is at a low level. Switches 71, 73, 75, 77, and 79 are nonconductive and capacitors 72, 74, 76, and 78 are electrically isolated from each other. Switches 81, 82, 83, 84, 85, 86, 87, and 88 are switched on and conductive. Capacitor 72 is coupled between input terminal 61 and conductor 65 via switches 82 and 81, respectively. The voltage across capacitor 72 is substantially equal to the difference between the voltage level of the first component of the input signal, e.g., $V_{in1}$, and the reference voltage level, e.g., ground voltage. Capacitor 74 is coupled between input terminals 61 and 62 via switches 84 and 83, respectively. The voltage across capacitor 74 is substantially equal to the difference between $V_{in1}$ and the voltage level of the second component of the input signal, e.g., $V_{in2}$. Capacitor 76 is coupled between input terminals 61 and 62 via switches 86 and 85, respectively. The voltage across capacitor 76 is substantially equal to the difference between $V_{in1}$ and $V_{in2}$. Capacitor 78 is coupled between conductor 65 and input terminal 62 via switches 88 and 87, respectively. The voltage across capacitor 78 is substantially equal to the difference between ground voltage and $V_{in2}$. Thus, sampling capacitor 72 samples the first component of the input signal, each of sampling capacitors 74 and 76 samples both the first and second components of the input signal, and sampling capacitor 76 samples the second component of the input signal.

At time $t_1$, sampling signal $\Phi_1$ switches to a low level and integrating signal $\Phi_2$ remains at the low level. Switches 71, 73, 75, 77, and 79 remain nonconductive. Switches 81, 82, 83, 84, 85, 86, 87, and 88 are switched off, decoupling capacitors 72, 74, 76, and 78 from respective applied voltage signals, thereby terminating the sampling phase. Capacitors 72, 74, 76, and 78 are electrically isolated from each other and from applied voltage signals.

The integrating phase starts at time $t_2$ when sampling signal $\Phi_1$ remains at the low level and integrating signal $\Phi_2$ switches to a high level. Switches 81, 82, 83, 84, 85, 86, 87, and 88 remain nonconductive. Switches 71, 73, 75, 77, and 79 are switched on. Capacitors 72, 74, 76, and 78 are serially coupled between the inverting and noninverting inputs of operational amplifier 92. Immediately after time $t_2$, the voltage difference between the inverting and noninverting inputs of operational amplifier 92 is temporarily substantially equal to three times the voltage difference between the first and second components of the sampled input signal, i.e., $3(V_{in1}-V_{in2})$. Operational amplifier 92 drives the voltage difference between its noninverting and inverting inputs to substantially zero, causing the charge stored in sampling capacitors 72, 74, 76, and 78 to be transferred to integrating capacitors 93 and 94.

If $(V_{in1}-V_{in2})$ is positive, the noninverting input is initially at a lower voltage level than the inverting input. Negative charge is transferred to integrating capacitor 93 via switch 71 and positive charge is transferred to integrating capacitor 94 via switch 79. The charge transfer process raises the voltage level at output terminal 63 and lowers the voltage level at output terminal 64. If $(V_{in1}-V_{in2})$ is negative, the noninverting input is initially at a higher voltage level than the inverting input. Positive charge is transferred to integrating capacitor 93 via switch 71 and negative charge is transferred to integrating capacitor 94 via switch 79. The charge transfer process lowers the voltage level at output terminal 63 and raises the voltage level at output terminal 64. Therefore, a differential output signal is transmitted to output terminals 63 and 64. It should be noted that the charges transferred to capacitors 93 and 94 are added to the charges that may already reside on capacitors 93 and 94, respectively, before time $t_2$.

At time $t_3$, sampling signal $\Phi_1$ remains at the low level and integrating signal $\Phi_2$ switches to a low level. Switches 81, 82, 83, 84, 85, 86, 87, and 88 remain nonconductive. Switches 71, 73, 75, 77, and 79 are switched off, terminating the integrating phase and the current clock cycle. Capacitors 72, 74, 76, and 78 are electrically isolated from each other and from applied voltage signals. Switched capacitor circuit 60 is ready to sample the input signal at input terminals 61 and 62 in the next clock cycle.

Switched capacitor circuit 60 uses four sampling capacitors 72, 74, 76, and 78 to perform a 4×oversampling in the space domain without increasing the sampling frequency. During the integrating phase, the initial voltage across capacitors 72, 74, 76, and 78 is $3(V_{in1}-V_{in2})$. Thus, the input voltage signal is scaled by a factor of ¾. Compared with a conventional switched capacitor circuit, the signal to noise ratio of switched capacitor circuit 60 is improved by a factor of $4\times(\frac{3}{4})^2$, i.e., %. A switched capacitor circuit having a structure similar to that of switched capacitor circuit 60 but having N sampling capacitors generally reduces the sampling noise by a factor of $(N-1)^2/N$.

Figure 4:
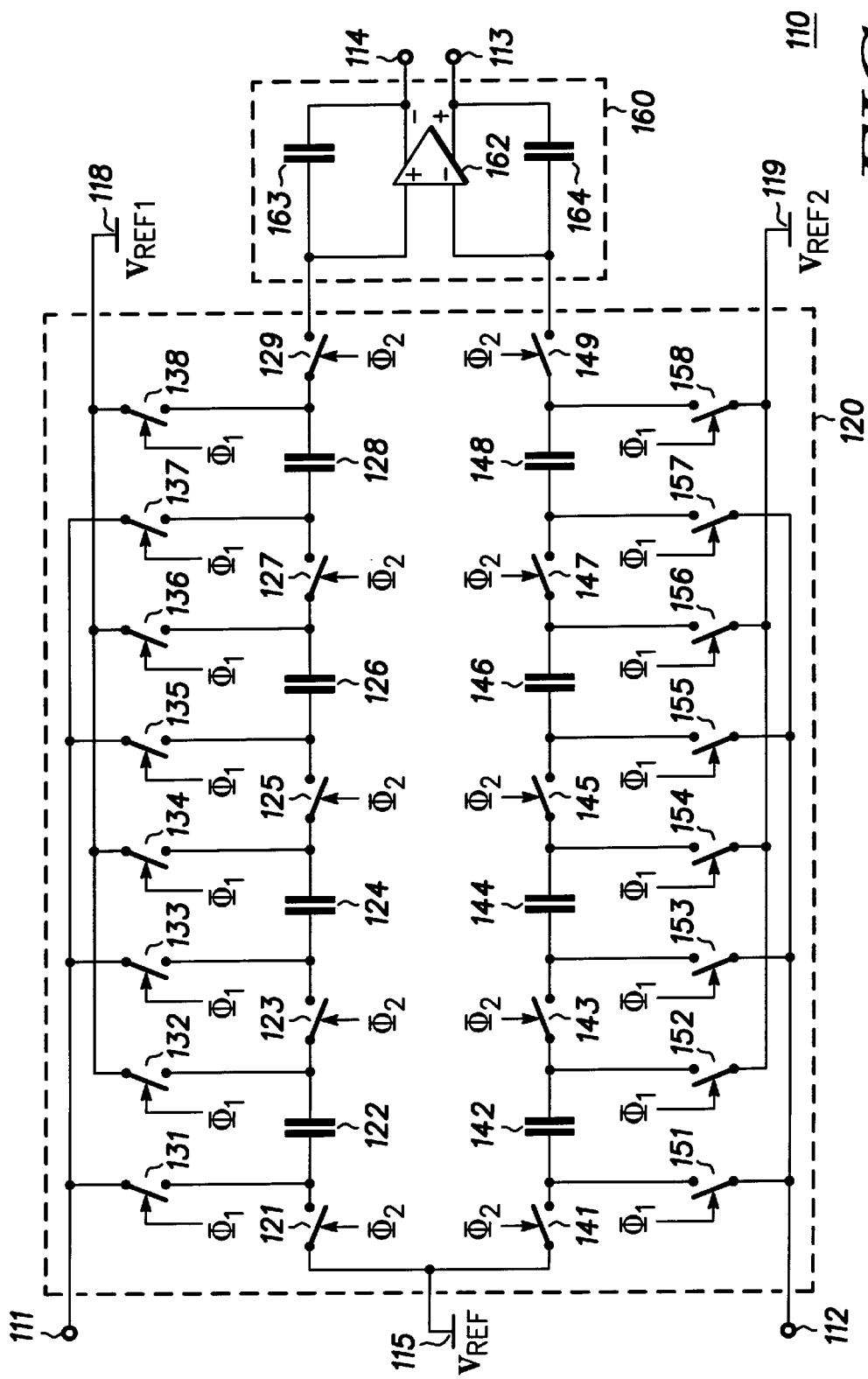

FIG. 4 is a schematic diagram of a switched capacitor circuit 110 in accordance with a third embodiment of the present invention. Switched capacitor circuit 110 is coupled for receiving a differential input signal via a pair of input terminals 111 and 112, and coupled for transmitting a differential output signal via a pair of output terminals 113 and 114. Reference signals $V_{REF}$, $V_{REF1}$, and $V_{REF2}$ are supplied to switched capacitor circuit 110 via voltage supply conductors 115, 118, and 119, respectively. It should be noted that reference voltage signals $V_{REF}$, $V_{REF1}$, and $V_{REF2}$ can be either different from each other or substantially equal to each other. Internally, switched capacitor circuit 110 includes a sampler 120 and an integrator 160.

Sampler 120 includes sampling capacitors 122, 124, 126, and 128 and switches 121, 123, 125, 127, 129, 131, 132, 133, 134, 135, 136, 137, and 138. Preferably, the capacitance values of capacitors 122, 124, 126, and 128 are substantially equal to each other. A first electrode of capacitor 122 is coupled to conductor 115 via switch 121 and to input terminal 111 via switch 131. A second electrode of capacitor 122 is coupled to a first electrode of capacitor 124 via switch 123 and to conductor 118 via switch 132. The first electrode of capacitor 124 is also coupled to input terminal 111 via switch 133. A second electrode of capacitor 124 is coupled to a first electrode of capacitor 126 via switch 125 and to conductor 118 via switch 134. The first electrode of capacitor 126 is also coupled to input terminal 111 via switch 135. A second electrode of capacitor 126 is coupled to a first electrode of capacitor 128 via switch 127 and to conductor 118 via switch 136. The first electrode of capacitor 128 is also coupled to input terminal 111 via switch 137. A second electrode of capacitor 128 is coupled for transmitting a first sampled signal of sampler 120 via switch 129 and coupled to conductor 118 via switch 138. The control electrodes of 131, 132, 133, 134, 135, 136, 137, and 138 are coupled for receiving a sampling signal $\Phi_1$. The control electrodes of switches 121, 123, 125, 127, and 129 are coupled for receiving an integrating signal $\Phi_2$.

Sampler 120 also includes sampling capacitors 142, 144, 146, and 148 and switches 141, 143, 145, 147, 149, 151, 152, 153, 154, 155, 156, 157, and 158. Preferably, the capacitance values of capacitors 142, 144, 146, and 148 are substantially equal to each other and to those of capacitors 122, 124, 126, and 128. A first electrode of capacitor 142 is coupled to conductor 115 via switch 141 and to input terminal 112 via switch 151. A second electrode of capacitor 142 is coupled to a first electrode of capacitor 144 via switch 143 and to conductor 119 via switch 152. The first electrode of capacitor 144 is also coupled to input terminal 112 via switch 153. A second electrode of capacitor 144 is coupled to a first electrode of capacitor 146 via switch 145 and to conductor 119 via switch 154. The first electrode of capacitor 146 is also coupled to input terminal 112 via switch 155. A second electrode of capacitor 146 is coupled to a first electrode of capacitor 148 via switch 147 and to conductor 119 via switch 156. The first electrode of capacitor 148 is also coupled to input terminal 112 via switch 157. A second electrode of capacitor 148 is coupled for transmitting a second sampled signal of sampler 120 via switch 149 and coupled to conductor 119 via switch 158. The control electrodes of switches 151, 152, 153, 154, 155, 156, 157, and 158 are coupled for receiving sampling signal $\Phi_1$. The control electrodes of switches 141, 143, 145, 147, and 149 are coupled for receiving integrating signal $\Phi_2$.

Devices that can be used as switches 121, 123, 125, 127, 129, 131, 132, 133, 134, 135, 136, 137, 138, 141, 143, 145, 147, 149, 151, 152, 153, 154, 155, 156, 157, and 158 include IGFETs, MESFETs, bipolar transistors, insulated gate bipolar transistors, and the like. Like switches 22, 24, 26, and 28 of switched capacitor circuit 10 shown in FIG. 1, switches 121, 123, 125, 127, 129, 141, 143, 145, 147, and 149 are also referred to as integrating switches. Switches 121, 123, 125, 127, and 129 are serially coupled with capacitors 122, 124, 126, and 128 to form a first arrangement of alternating integrating switches and sampling capacitors. Switches 141, 143, 145, 147, and 149 are serially coupled with capacitors 142, 144, 146, and 148 to form a second arrangement of alternating integrating switches and sampling capacitors. Like switches 33, 34, 35, 36, 37, and 38 of switched capacitor circuit 10 shown in FIG. 1, switches 131, 132, 133, 134, 135, 136, 137, 138, 151, 152, 153, 154, 155, 156, 157, and 158 are also referred to as sampling switches.

Integrator 160 includes an operational amplifier 162, and integrating capacitors 163 and 164. Preferably, the capacitance values of integrating capacitors 163 and 164 are substantially equal to each other. Operational amplifier 162 has a noninverting input coupled to the second electrode of capacitor 128 via switch 129, and an inverting input coupled to the second electrode of capacitor 148 via switch 149. Operational amplifier 162 also has a noninverting output and an inverting output coupled to output terminals 113 and 114, respectively. Capacitor 163 has one electrode connected to the noninverting input of operational amplifier 162 and another electrode connected to the inverting output of operational amplifier 162. Capacitor 164 has one electrode connected to the inverting input of operational amplifier 162 and another electrode connected to the noninverting output of operational amplifier 162.

It should be understood that the structure of switched capacitor circuit 110 is not limited to being that shown in FIG. 4. For example, in an alternative embodiment, the second electrodes of capacitors 122, 124, 126, 128, 142, 144, 146, and 148 are coupled via switches 132, 134, 136, 138, 152, 154, 156, and 158, respectively, for receiving feedback signals generated by a feedback circuit (not shown) coupled to the outputs of integrator 160. Further, switched capacitor circuit 110 is not limited to having eight sampling capacitors, i.e., capacitors 122, 124, 126, 128, 142, 144, 146, and 148. In accordance with the present invention, the number of sampling capacitors in switched capacitor circuit 110 can be any even number greater than two, e.g., four, six, ten, twelve, fourteen, etc. Generally, the sampling rate of switched capacitor circuit 110 is equal to the number of sampling capacitors therein divided by two.

In operation, switched capacitor circuit 110 samples the differential input signal at input terminals 111 and 112, integrates the differential input signal, and transmits the integrated signal to output terminals 113 and 114. Switched capacitor circuit 110 can operate on sampling signal $\Phi_1$ and integrating signal $\Phi_2$ shown in timing diagram 50 of FIG. 2. As mentioned hereinbefore, FIG. 2 shows one clock cycle that includes a sampling phase and an integrating phase.

The sampling phase starts at time $t_0$ when sampling signal $\Phi_1$ switches to a high level and integrating signal $\Phi_2$ is at a low level. Switches 121, 123, 125, 127, and 129 are nonconductive and capacitors 122, 124, 126, and 128 are electrically isolated from each other. Switches 131, 132, 133, 134, 135, 136, 137, and 138 are switched on and conductive. Each of capacitors 122, 124, 126, and 128 is coupled between input terminal 111 and conductor 118 via respective switches. The voltage across each of capacitors 122, 124, 126, and 128 is substantially equal to the difference between the voltage level of the first component of the input signal, e.g., $V_{in1}$, and reference voltage $V_{REF1}$. Thus, each of sampling capacitors 122, 124, 126, and 128 samples the first component of the input signal once during the sampling phase. Likewise, switches 141, 143, 145, 147, and 149 are nonconductive and capacitors 142, 144, 146, and 148 are electrically isolated from each other. Switches 151, 152, 153, 154, 155, 156, 157, and 158 are switched on and conductive. Each of capacitors 142, 144, 146, and 148 is coupled between input terminal 112 and conductor 119 via respective switches. The voltage across each of capacitors 142, 144, 146, and 148 is substantially equal to the difference between the voltage level of the second component of the input signal, e.g., $V_{in2}$, and reference voltage $V_{REF2}$. Thus, each of sampling capacitors 142, 144, 146, and 148 samples the second component of the input signal once during the sampling phase.

At time $t_1$, sampling signal $\Phi_1$ switches to a low level and integrating signal $\Phi_2$ remains at the low level. Switches 121, 123, 125, 127, 129, 141, 143, 145, 147, and 149 remain nonconductive. Switches 131, 132, 133, 134, 135, 136, 137, 138, 151, 152, 153, 154, 155, 156, 157, and 158 are switched off, decoupling capacitors 122, 124, 126, 128, 142, 144, 146, and 148 from respective applied voltage signals, thereby terminating the sampling phase. Capacitors 122, 124, 126, 128, 142, 144, 146, and 148 are electrically isolated from each other and from applied voltage signals.

The integrating phase starts at time $t_2$ when sampling signal $\Phi_1$ remains at the low level and integrating signal $\Phi_2$ switches to a high level. Switches 131, 132, 133, 134, 135, 136, 137, 138, 151, 152, 153, 154, 155, 156, 157, and 158 remain nonconductive. Switches 121, 123, 125, 127, 129, 141, 143, 145, 147, and 149 are switched on and conductive. Capacitors 122, 124, 126, and 128 are serially coupled between conductor 115 and the noninverting input of operational amplifier 162. Immediately after time $t_2$, the voltage level at the noninverting input of operational amplifier 162 is temporarily substantially equal to negative four times the voltage difference between the first component of the sampled input signal and the first reference signal at conductor 118, i.e., $-4(V_{in1}-V_{REF1})$ if $V_{REF1}$ is substantially equal to $V_{REF}$. Otherwise, there is a DC voltage offset in the voltage at the noninverting input of operational amplifier 162. Operational amplifier 162 drives the voltage level at its noninverting input to ground voltage, causing the charge stored in sampling capacitors 122, 124, 126, and 128 to be transferred to integrating capacitor 163. The amount of charge transferred to integrating capacitor 163 is substantially equal to the average of charges stored in capacitors 122, 124, 126, and 128 before time $t_2$. Thus, the charge transferred to integrating capacitor 163 represents an average value of the four samples of the first component of the input signal. Likewise, capacitors 142, 144, 146, and 148 are serially coupled between conductor 115 and the inverting input of operational amplifier 162, and the voltage level at the inverting input of operational amplifier 162 is temporarily substantially equal to negative four times the voltage difference between the second component of the sampled input signal and the second reference signal at conductor 119, i.e., $-4(V_{in2}-V_{REF2})$ if $V_{REF2}$ is substantially equal to $V_{REF}$. Otherwise, there is a DC voltage offset in the voltage at the inverting input of operational amplifier 162. Operational amplifier 162 drives the voltage level at its inverting input to ground voltage, causing the charge stored in sampling capacitors 142, 144, 146, and 148 to be transferred to integrating capacitor 164. The amount of charge transferred to integrating capacitor 164 is substantially equal to the average of charges stored in capacitors 142, 144, 146, and 148 before time $t_2$. Thus, the charge transferred to integrating capacitor 164 represents an average value of the four samples of the second component of the input signal. Therefore, switched capacitor circuit 110 performs a 4×oversampling of the input signal. It should be noted that the charges transferred to capacitors 163 and 164 are added to the charges that may already reside on capacitors 163 and 164, respectively, before time $t_2$.

At time $t_3$, sampling signal $\Phi_1$ remains at the low level and integrating signal $\Phi_2$ switches to a low level. Switches 131, 132, 133, 134, 135, 136, 137, 138, 151, 152, 153, 154, 155, 156, 157, and 158 remain nonconductive. Switches 121, 123, 125, 127, 129, 141, 143, 145, 147, and 149 are switched off, terminating the integrating phase and the current clock cycle. Capacitors 122, 124, 126, 128, 142, 144, 146, and 148 are electrically isolated from each other and from applied voltage signals. Switched capacitor circuit 110 is ready to sample the input signal at input terminals 111 and 112 in a subsequent clock cycle.

As mentioned hereinbefore, switched capacitor circuit 110 performs a 4×oversampling of the input signal at input terminals 111 and 112. Switched capacitor circuit 110 uses eight sampling capacitors 122, 124, 126, 128, 142, 144, 146, and 148 to oversample the input signal in the space domain without increasing the sampling frequency. The 4×oversampling effectively reduces the sampling noise of switched capacitor circuit 110 by a factor of four.

Figure 5:
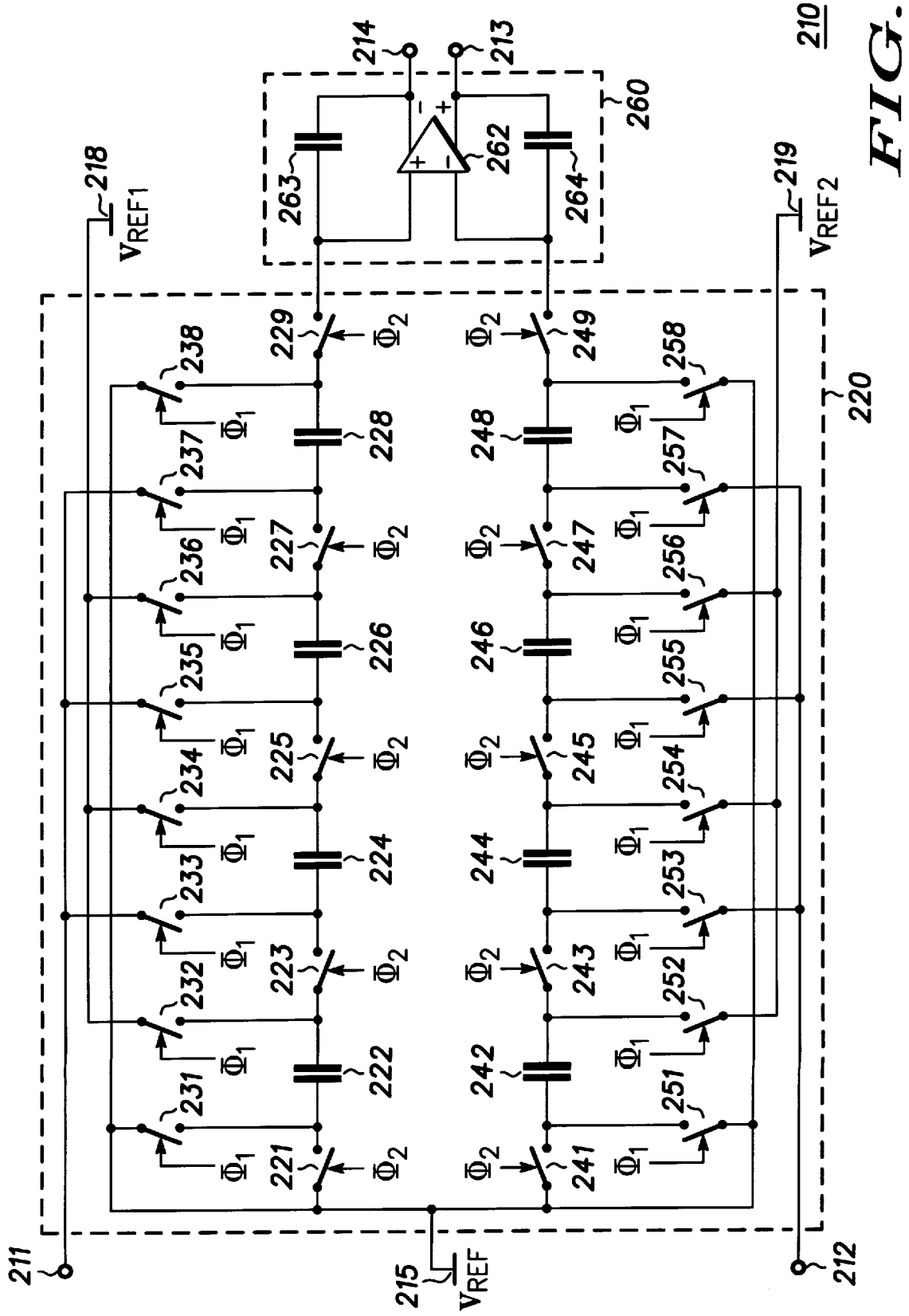

FIG. 5 is a schematic diagram of a switched capacitor circuit 210 in accordance with a fourth embodiment of the present invention. Switched capacitor circuit 210 is coupled for receiving a differential input signal via a pair of input terminals 211 and 212, and coupled for transmitting a differential output signal via a pair of output terminals 213 and 214. Reference signals $V_{REF}$, $V_{REF1}$, and $V_{REF2}$ are supplied to switched capacitor circuit 210 via voltage supply conductors 215, 218, and 219, respectively. It should be noted that reference voltage signals $V_{REF}$, $V_{REF1}$, and $V_{REF2}$ can be either different from each other or substantially equal to each other. Internally, switched capacitor circuit 210 includes a sampler 220 and an integrator 260.

Sampler 220 includes sampling capacitors 222, 224, 226, 228, 242, 244, 246, and 248. Preferably, the capacitance values of capacitors 222, 224, 226, 228, 242, 244, 246, and 248 are substantially equal to each other. Sampler 220 also includes switches 221, 223, 225, 227, 229, 231, 232, 233, 234, 235, 236, 237, 238, 241, 243, 245, 247, 249, 251, 252, 253, 254, 255, 256, 257, and 258, each having a control electrode and two current conducting electrodes. The control electrodes of 231, 232, 233, 234, 235, 236, 237, 238, 251, 252, 253, 254, 255, 256, 257, and 258 are coupled for receiving a sampling signal $\Phi_1$. The control electrodes of switches 221, 223, 225, 227, 229, 241, 243, 245, 247, and 249 are coupled for receiving an integrating signal $\Phi_2$.

A first electrode of capacitor 222 is coupled to conductor 215 via switches 221 and 231 coupled in parallel. A second electrode of capacitor 222 is coupled to a first electrode of capacitor 224 via switch 223 and to conductor 218 via switch 232. The first electrode of capacitor 224 is also coupled to input terminal 211 via switch 233. A second electrode of capacitor 224 is coupled to a first electrode of capacitor 226 via switch 225 and to conductor 218 via switch 234. The first electrode of capacitor 226 is also coupled to input terminal 211 via switch 235. A second electrode of capacitor 226 is coupled to a first electrode of capacitor 228 via switch 227 and to conductor 218 via switch 236. The first electrode of capacitor 228 is also coupled to input terminal 211 via switch 237. A second electrode of capacitor 228 is coupled for transmitting a first sampled signal of sampler 220 via switch 229 and coupled to conductor 218 via switch 238.

A first electrode of capacitor 242 is coupled to conductor 215 via switches 241 and 251 coupled in parallel. A second electrode of capacitor 242 is coupled to a first electrode of capacitor 244 via switch 243 and to conductor 219 via switch 252. The first electrode of capacitor 244 is also coupled to input terminal 212 via switch 253. A second electrode of capacitor 244 is coupled to a first electrode of capacitor 246 via switch 245 and to conductor 219 via switch 254. The first electrode of capacitor 246 is also coupled to input terminal 212 via switch 255. A second electrode of capacitor 246 is coupled to a first electrode of capacitor 248 via switch 247 and to conductor 219 via switch 256. The first electrode of capacitor 248 is also coupled to input terminal 212 via switch 257. A second electrode of capacitor 248 is coupled for transmitting a second sampled signal of sampler 220 via switch 249 and coupled to conductor 219 via switch 258.

Devices that can be used as switches 221, 223, 225, 227, 229, 231, 232, 233, 234, 235, 236, 237, 238, 241, 243, 245, 247, 249, 251, 252, 253, 254, 255, 256, 257, and 258 include IGFETs, MESFETs, bipolar transistors, insulated gate bipolar transistors, and the like. Like switches 22, 24, 26, and 28 of switched capacitor circuit 10 shown in FIG. 1, switches 221, 223, 225, 227, 229, 241, 243, 245, 247, and 249 are also referred to as integrating switches. Switches 221, 223, 225, 227, and 229 are serially coupled with capacitors 222, 224, 226, and 228 to form a first arrangement of alternating integrating switches and sampling capacitors. Switches 241, 243, 245, 247, and 249 are serially coupled with capacitors 242, 244, 246, and 248 to form a second arrangement of alternating integrating switches and sampling capacitors. Like switches 33, 34, 35, 36, 37, and 38 of switched capacitor circuit 10 shown in FIG. 1, switches 231, 232, 233, 234, 235, 236, 237, 238, 251, 252, 253, 254, 255, 256, 257, and 258 are also referred to as sampling switches.

Integrator 260 includes an operational amplifier 262, and integrating capacitors 263 and 264. Preferably, the capacitance values of integrating capacitors 263 and 264 are substantially equal to each other. Operational amplifier 262 has a noninverting input coupled to the second electrode of capacitor 228 via switch 229, and an inverting input coupled to the second electrode of capacitor 248 via switch 249. Operational amplifier 262 also has a noninverting output and an inverting output coupled to output terminals 213 and 214, respectively. Capacitor 263 has one electrode connected to the noninverting input of operational amplifier 262 and another electrode connected to the inverting output of operational amplifier 262. Capacitor 264 has one electrode connected to the inverting input of operational amplifier 262 and another electrode connected to the noninverting output of operational amplifier 262.

It should be understood that the structure of switched capacitor circuit 210 is not limited to being that shown in FIG. 5. For example, in an alternative embodiment, the second electrodes of capacitors 222, 224, 226, 242, 244, and 246 are coupled via switches 232, 234, 236, 252, 254, and 256, respectively, for receiving feedback signals generated by a feedback circuit (not shown) coupled to the outputs of integrator 260. Further, switched capacitor circuit 210 is not limited to having eight sampling capacitors, i.e., capacitors 222, 224, 226, 228, 242, 244, 246, and 248. In accordance with the present invention, the number of sampling capacitors in switched capacitor circuit 210 can be any even number greater than two, e.g., four, six, ten, twelve, fourteen, sixteen, etc.

In operation, switched capacitor circuit 210 samples the differential input signal at input terminals 211 and 212, integrates the differential input signal, and transmits the integrated signal to output terminals 213 and 214. Switched capacitor circuit 210 can operate on sampling signal $\Phi_1$ and integrating signal $\Phi_2$ shown in timing diagram 50 of FIG. 2. As mentioned hereinbefore, FIG. 2 shows one clock cycle that includes a sampling phase and an integrating phase.

The sampling phase starts at time $t_0$ when sampling signal $\Phi_1$ switches to a high level and integrating signal $\Phi_2$ is at a low level. Switches 221, 223, 225, 227, and 229 are nonconductive, and capacitors 222, 224, 226, and 228 are electrically isolated from each other. Switches 231, 232, 233, 234, 235, 236, 237, and 238 are switched on and conductive. Capacitor 222 is coupled between conductor 215 and conductor 218 via switches 231 and 232, respectively. The voltage across capacitor 222 is substantially equal to the difference between reference voltages $V_{REF}$ and $V_{REF1}$. Capacitor 224 is coupled between input terminal 211 and conductor 218 via switches 233 and 234, respectively. The voltage across capacitor 224 is substantially equal to the difference between the voltage level of the first component of the input signal, e.g., $V_{in1}$, and $V_{REF1}$. Capacitor 226 is coupled between input terminal 211 and conductor 218 via switches 235 and 236, respectively. The voltage across capacitor 226 is substantially equal to the difference between $V_{in1}$ and $V_{REF1}$. Capacitor 228 is coupled between input terminal 211 and conductor 215 via switches 237 and 238, respectively. The voltage across capacitor 228 is substantially equal to the difference between $V_{in1}$ and $V_{REF}$. Likewise, switches 241, 243, 245, 247, and 249 are nonconductive, and capacitors 242, 244, 246, and 248 are electrically isolated from each other. Switches 251, 252, 253, 254, 255, 256, 257, and 258 are switched on and conductive. Capacitor 242 is coupled between conductor 215 and conductor 219 via switches 251 and 252, respectively. The voltage across capacitor 242 is substantially equal to the difference between reference voltages $V_{REF}$ and $V_{REF2}$. Capacitor 244 is coupled between input terminal 212 and conductor 219 via switches 253 and 254, respectively. The voltage across capacitor 244 is substantially equal to the difference between the voltage level of the second component of the input signal, e.g., $V_{in2}$, and $V_{REF2}$. Capacitor 246 is coupled between input terminal 212 and conductor 219 via switches 255 and 256, respectively. The voltage across capacitor 246 is substantially equal to the difference between $V_{in2}$ and $V_{REF2}$. Capacitor 248 is coupled between input terminal 212 and conductor 215 via switches 257 and 258, respectively. The voltage across capacitor 248 is substantially equal to the difference between $V_{in2}$ and $V_{REF}$.

At time $t_1$, sampling signal $\Phi_1$ switches to a low level and integrating signal $\Phi_2$ remains at the low level. Switches 221, 223, 225, 227, 229, 241, 243, 245, 247, and 249 remain nonconductive. Switches 231, 232, 233, 234, 235, 236, 237, 238, 251, 252, 253, 254, 255, 256, 257, and 258 are switched off, decoupling capacitors 222, 224, 226, 228, 242, 244, 246, and 248 from respective applied voltage signals, thereby terminating the sampling phase. Capacitors 222, 224, 226, 228, 242, 244, 246, and 248 are electrically isolated from each other and from applied voltage signals.

The integrating phase starts at time $t_2$ when sampling signal $\Phi_1$ remains at the low level and integrating signal $\Phi_2$ switches to a high level. Switches 231, 232, 233, 234, 235, 236, 237, 238, 251, 252, 253, 254, 255, 256, 257, and 258 remain nonconductive. Switches 221, 223, 225, 227, 229, 241, 243, 245, 247, and 249 are switched on and conductive. Capacitors 222, 224, 226, and 228 are serially coupled between conductor 215 and the noninverting input of operational amplifier 262. Immediately after time $t_2$, the voltage level at the noninverting input of operational amplifier 262 is temporarily substantially equal to negative three times the voltage difference between the first component of the sampled input signal and the reference signal at conductor 218, i.e., $-3(V_{in1}-V_{REF1})$ if $V_{REF1}$ is substantially equal to $V_{REF}$. Otherwise, there is a DC voltage offset in the voltage at the noninverting input of operational amplifier 262. Operational amplifier 262 drives the voltage level at its noninverting input to ground voltage, causing the charge stored in sampling capacitors 222, 224, 226, and 228 to be transferred to integrating capacitor 263. Likewise, capacitors 242, 244, 246, and 248 are serially coupled between conductor 215 and the inverting input of operational amplifier 262, and the voltage level at the inverting input of operational amplifier 262 is temporarily substantially equal to negative three times the voltage difference between the second component of the sampled input signal and the reference signal at conductor 219, i.e., $-3(V_{in2}-V_{REF2})$ if $V_{REF2}$ is substantially equal to $V_{REF}$. Otherwise, there is a DC voltage offset in the voltage at the inverting input of operational amplifier 262. Operational amplifier 262 drives the voltage level at its inverting input to ground voltage, causing the charge stored in sampling capacitors 242, 244, 246, and 248 to be transferred to integrating capacitor 264. It should be noted that the charges transferred to capacitors 263 and 264 are added to the charges that may already reside on capacitors 263 and 264, respectively, before time $t_2$.

At time $t_3$, sampling signal $\Phi_1$ remains at the low level and integrating signal $\Phi_2$ switches to a low level. Switches 231, 232, 233, 234, 235, 236, 237, 238, 251, 252, 253, 254, 255, 256, 257, and 258 remain nonconductive. Switches 221, 223, 225, 227, 229, 241, 243, 245, 247, and 249 are switched off, terminating the integrating phase and the current clock cycle. Capacitors 222, 224, 226, 228, 242, 244, 246, and 248 are electrically isolated from each other and from applied voltage signals. Switched capacitor circuit 210 is ready to sample the input signal in the next clock cycle.

Switched capacitor circuit 210 uses eight sampling capacitors 222, 224, 226, 228, 242, 244, 246, and 248 to perform a 4×oversampling in space domain without increasing the sampling frequency. During the integrating phase, the initial voltage across sampling capacitors 222, 224, 226, and 228 is $3(V_{in1}-V_{REF1})$, and the initial voltage across sampling capacitors 242, 244, 246, and 248 is $3(V_{in2}-V_{REF2})$. Like sampler 70 in FIG. 3, sampler 220 scales the differential input voltage signal by a factor of ¾. Compared with a conventional switched capacitor circuit, the signal to noise ratio of switched capacitor circuit 210 is improved by a factor of $4\times(¾)^2$, i.e., 9/4. Generally, a switched capacitor circuit having a structure similar to that of switched capacitor circuit 210 but having 2 N sampling capacitors reduces the sampling noise by a factor of $(N-1)^2/N$.

Figure 6:
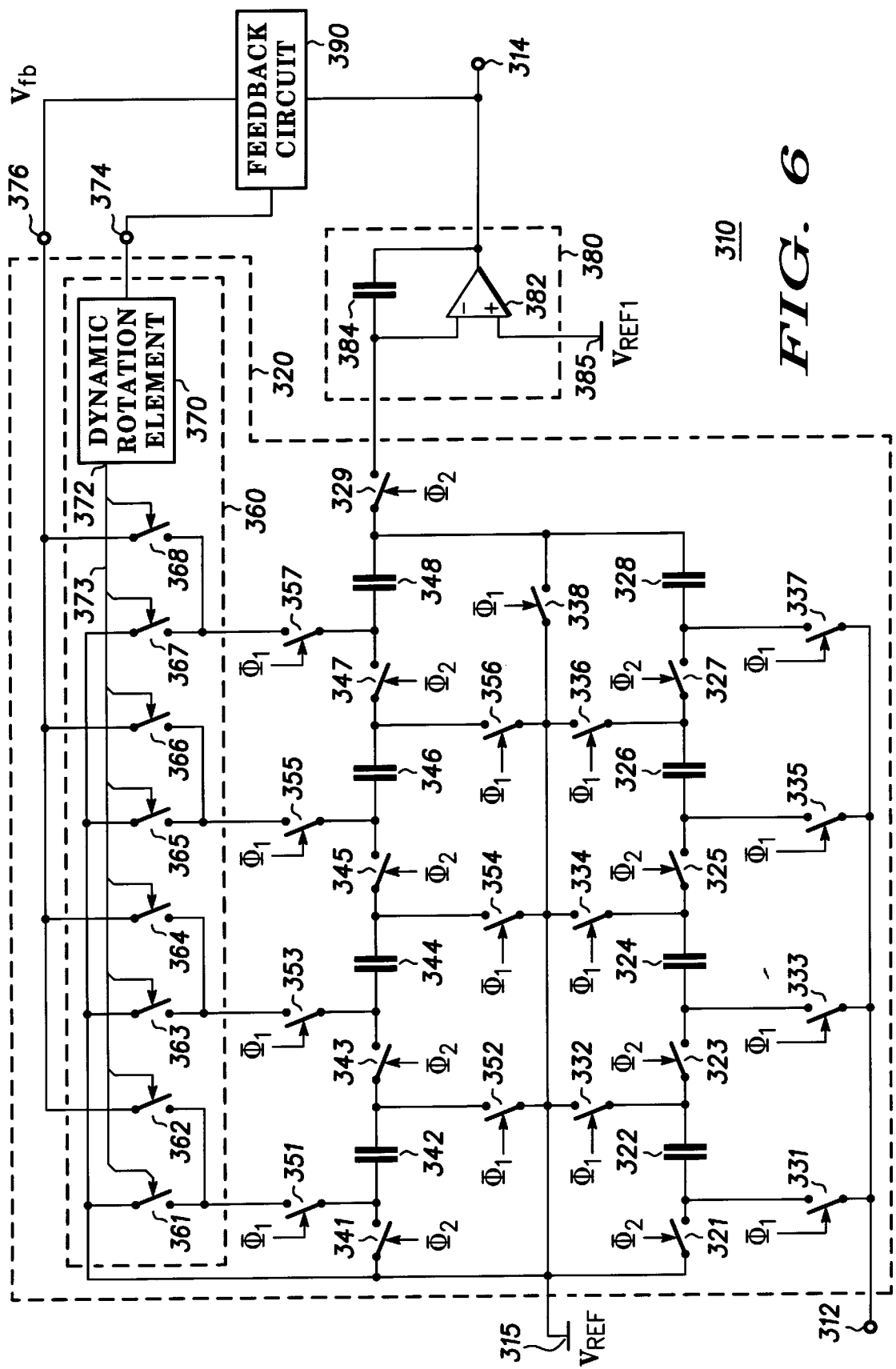

FIG. 6 is a schematic diagram of a switched capacitor circuit 310 in accordance with a fifth embodiment of the present invention. Switched capacitor circuit 310 is coupled for receiving an input signal via an input terminal 312, and coupled for transmitting an output signal via an output terminal 314. Reference signals $V_{REF}$ and $V_{REF1}$ are supplied to switched capacitor circuit 310 via voltage supply conductors 315 and 385, respectively. It should be noted that reference voltage signals $V_{REF}$ and $V_{REF1}$ can be either different from each other or substantially equal to each other. Internally, switched capacitor circuit 310 includes a sampler 320 and an integrator 380.

Sampler 320 includes sampling capacitors 322, 324, 326, and 328 and switches 321, 323, 325, 327, 329, 331, 332, 333, 334, 335, 336, 337, and 338. Preferably, the capacitance values of capacitors 322, 324, 326, and 328 are substantially equal to each other. A first electrode of capacitor 322 is coupled to conductor 315 via switch 321 and to input terminal 312 via switch 331. A second electrode of capacitor 322 is coupled to a first electrode of capacitor 324 via switch 323 and to conductor 315 via switch 332. The first electrode of capacitor 324 is also coupled to input terminal 312 via switch 333. A second electrode of capacitor 324 is coupled to a first electrode of capacitor 326 via switch 325 and to conductor 315 via switch 334. The first electrode of capacitor 326 is also coupled to input terminal 312 via switch 335. A second electrode of capacitor 326 is coupled to a first electrode of capacitor 328 via switch 327 and to conductor 315 via switch 336. The first electrode of capacitor 328 is also coupled to input terminal 312 via switch 337. A second electrode of capacitor 328 is coupled for transmitting a sampled signal of sampler 320 via switch 329 and coupled to conductor 315 via switch 338. The control electrodes of 331, 332, 333, 334, 335, 336, 337, and 338 are coupled for receiving a sampling signal $\Phi_1$. The control electrodes of switches 321, 323, 325, 327, and 329 are coupled for receiving an integrating signal $\Phi_2$.

Sampler 320 also includes feedback capacitors 342, 344, 346, and 348 and switches 341, 343, 345, 347, 351, 352, 353, 354, 355, 356, and 357. Preferably, the capacitance values of capacitors 342, 344, 346, and 348 are substantially equal to each other and to those of capacitors 322, 324, 326, and 328. Sampler 320 further includes a feedback controller 360, which includes switches 361, 362, 363, 364, 365, 366, 367, and 368 and a dynamic rotation element 370. In operation, feedback controller 360 cooperates with capacitors 342, 344, 346, and 348 to provide a multilevel feedback signal.

A first electrode of capacitor 342 is coupled to conductor 315 via switch 341 and to the first current conducting electrodes of switch 361 and 362 via switch 351. A second electrode of capacitor 342 is coupled to a first electrode of capacitor 344 via switch 343 and to conductor 315 via switch 352. The first electrode of capacitor 344 is also coupled to the first current conducting electrodes of switch 363 and 364 via switch 353. A second electrode of capacitor 344 is coupled to a first electrode of capacitor 346 via switch 345 and to conductor 315 via switch 354. The first electrode of capacitor 346 is also coupled to the first current conducting electrodes of switch 365 and 366 via switch 355. A second electrode of capacitor 346 is coupled to a first electrode of capacitor 348 via switch 347 and to conductor 315 via switch 356. The first electrode of capacitor 348 is also coupled to the first current conducting electrodes of switch 367 and 368 via switch 357. A second electrode of capacitor 348 is coupled to the second electrode of capacitor 328. The control electrodes of 351, 352, 353, 354, 355, 356, and 357 are coupled for receiving sampling signal $\Phi_1$. The control electrodes of switches 341, 343, 345, and 347 are coupled for receiving integrating signal $\Phi_2$.

The control electrodes of switches 361, 362, 363, 364, 365, 366, 367, and 368 are coupled to an output port 372 of dynamic rotation element 370 via a data bus 373. An input of dynamic rotation element 370 is connected to a control terminal 374 of feedback controller 360 for receiving a control signal. The second current conducting electrodes of switches 361, 363, 365, and 367 are connected to conductor 315. The second current conducting electrodes of switches 362, 364, 366, and 368 are connected to a terminal 376 of feedback controller 360 for receiving a feedback signal $V_{fb}$.

Devices that can be used as switches 321, 323, 325, 327, 329, 331, 332, 333, 334, 335, 336, 337, 338, 341, 343, 345, 347, 351, 352, 353, 354, 355, 356, 357, 361, 362, 363, 364, 365, 366, 367, and 368 include IGFETs, MESFETs, bipolar transistors, insulated gate bipolar transistors, and the likes. Like switches 22, 24, 26, and 28 in switched capacitor circuit 10 of FIG. 1, switches 321, 323, 325, 327, 329, 341, 343, 345, and 347 are also referred to as integrating switches. Switches 321, 323, 325, 327, and 329 are serially coupled with capacitors 322, 324, 326, and 328 to form an arrangement of alternating integrating switches and sampling capacitors. Switches 341, 343, 345, and 347 are serially coupled with capacitors 342, 344, 346, and 348 to form an arrangement of alternating integrating switches and feedback capacitors. Like switches 33, 34, 35, 36, 37, and 38 of switched capacitor circuit 10 shown in FIG. 1, switches 331, 332, 333, 334, 335, 336, 337, 338, 351, 352, 353, 354, 355, 356, and 357 are also referred to as sampling switches. In feedback controller 360, each of switches 361, 363, 365, and 367 has one of its current conducting electrode coupled to reference voltage $V_{REF}$ at conductor 315 and is referred to as a shunt switch. Each of switches 362, 364, 366, and 368 has one of its current conducting electrode coupled to feedback signal $V_{fb}$ at terminal 376 and is referred to as a feedback switch.

Integrator 380 includes an operational amplifier 382, and an integrating capacitor 384. Operational amplifier 382 has a noninverting input connected to conductor 385, and an inverting input coupled to the second electrodes of capacitors 328 and 348 via switch 329. Operational amplifier 382 also has an output coupled to output terminal 314. Capacitor 384 has one electrode connected to the inverting input of operational amplifier 382 and another electrode connected to the output of operational amplifier 382.

Switched capacitor circuit 310 also includes a feedback circuit 390. An input of feedback circuit 390 is coupled to the output of operational amplifier 382. An output of feedback circuit 390 is connected to terminal 376 of feedback controller 360. Feedback circuit 390 also has a control output connected to control terminal 374 of feedback controller 360. In a preferred embodiment, feedback circuit 390 includes a comparator (not shown) that generates the feedback signal $V_{fb}$. Feedback circuit 390 also preferably includes a digital to analog converter (not shown) for generating a digital control signal at its control output. Therefore, the control output of feedback circuit 390 is also referred to as a digital control signal port.

It should be understood that the structure of switched capacitor circuit 310 is not limited to being that shown in FIG. 6. For example, switched capacitor circuit 310 is not limited to having four sampling capacitors, i.e., capacitors 322, 324, 326, and 328. In accordance with the present invention, the number of sampling capacitors in switched capacitor circuit 310 can be any number greater than one, e.g., two, three, five, six, etc. Generally, the sampling rate of switched capacitor circuit 310 is equal to the number of sampling capacitors therein. As described hereinafter, dynamic rotation element 370 serves to minimize the sampling noise and the effect of mismatch between feedback capacitors 342, 344, 346, and 348. Although preferred, dynamic rotation element 370 is optional in feedback controller 360.

In operation, switched capacitor circuit 310 samples the input signal at input terminals 312, integrates the input signal, and transmits the integrated signal to output terminal 314. Switched capacitor circuit 310 can operate on sampling signal $\Phi_1$ and integrating signal $\Phi_2$ shown in timing diagram 50 of FIG. 2. As mentioned hereinbefore, FIG. 2 shows one clock cycle that includes a sampling phase and an integrating phase.

The sampling phase starts at time $t_0$ when sampling signal $\Phi_1$ switches to a high level and integrating signal $\Phi_2$ is at a low level. Switches 321, 323, 325, 327, and 329 are nonconductive and capacitors 322, 324, 326, and 328 are electrically isolated from each other. Switches 331, 332, 333, 334, 335, 336, 337, and 338 are switched on and conductive. Each of capacitors 322, 324, 326, and 328 is coupled between input terminal 312 and conductor 315 via respective switches. The voltage across each of capacitors 322, 324, 326, and 328 is substantially equal to the difference between the voltage level of the input signal, e.g., $V_{in}$, and reference voltage $V_{REF}$. Thus, each of sampling capacitors 322, 324, 326, and 328 samples the input signal once during the sampling phase.

Likewise, switches 341, 343, 345, and 347 are nonconductive and capacitors 342, 344, 346, and 348 are electrically isolated from each other. Switches 351, 352, 353, 354, 355, 356, and 357 are switched on and conductive. Each of capacitors 342, 344, 346, and 348 is coupled between feedback controller 360 and conductor 315 via respective switches. Feedback circuit 390 sends the digital control signal and the feedback signal $V_{fb}$ to terminals 374 and 376, respectively, of feedback controller 360. Preferably, the control signal and the feedback signal $V_{fb}$ are generated in accordance with the output of operational amplifier 382. In a preferred embodiment, the digital control signal at control terminal 374 has five different digital values. Accordingly, the control signal can be encoded in a three-bit binary number.

Feedback controller 360 selectively charges feedback capacitors 342, 344, 346, and 348 in accordance with the digital control signal generated by feed back circuit 390. By way of example, when the control signal has a binary value of 000, switches 361, 363, 365, and 367 are conductive and switches 362, 364, 366, and 368 are nonconductive. Thus, the first electrodes of feedback capacitors 342, 344, 346, and 348 are coupled to conductor 315. The voltage across each of capacitors 342, 344, 346, and 348 is substantially zero. When the control signal has a binary value of 001, one of shunt switches 361, 363, 365, and 367 is nonconductive, the other three are conductive. Further, one of feedback switches 362, 364, 366, and 368 corresponding to the nonconductive shunt switch is conductive, and the other three are nonconductive. Thus, the voltage across one of feedback capacitors 342, 344, 346, and 348 is substantially equal to $(V_{fb}-V_{REF})$, and the voltages across the other three feedback capacitors are substantially zero. When the control signal has a binary value of 010, two of shunt switches 361, 363, 365, and 367 are nonconductive, the other two are conductive. Further, two of feedback switches 362, 364, 366, and 368 corresponding to the two nonconductive shunt switches are conductive, and the other two are nonconductive. Thus, the voltages across two of feedback capacitors 342, 344, 346, and 348 are substantially equal to $(V_{fb}-V_{REF})$, and the voltages across the other two feedback capacitors are substantially zero. When the control signal has a binary value of 011, three of shunt switches 361, 363, 365, and 367 are nonconductive, the other one is conductive. Further, three of feedback switches 362, 364, 366, and 368 corresponding to the three nonconductive shunt switches are conductive, and the other one is nonconductive. Thus, the voltages across three of feedback capacitors 342, 344, 346, and 348 are substantially equal to $(V_{fb}-V_{REF})$, and the voltages across the other one feedback capacitors is substantially zero. When the control signal has a binary value of 100, switches 361, 363, 365, and 367 are nonconductive and switches 362, 364, 366, and 368 are conductive. Thus, the first electrodes of feedback capacitors 342, 344, 346, and 348 are coupled to terminal 376. The voltage across each of capacitors 342, 344, 346, and 348 is substantially equal to $(V_{fb}-V_{REF})$.

Dynamic rotation element 370 receives the digital control signal from feedback circuit 390 and generates a configuration signal in accordance with an algorithm stored therein. The configuration signal is transmitted to the control electrodes of switches 361, 362, 363, 364, 365, 366, 367, and 368 and determines the configuration thereof. When the digital control signal has the binary value of 001, there are four possible choices of which feedback capacitor is coupled between the feedback signal $V_{fb}$ at terminal 376 and the reference voltage $V_{REF}$ at conductor 315. When the digital control signal has the binary value of 010, there are six possible choices of which pair of feedback capacitors are coupled between the feedback signal $V_{fb}$ and the reference voltage $V_{REF}$. When the digital control signal has the binary value of 011, there are four possible choices of which trio of feedback capacitors are coupled between the feedback signal $V_{fb}$ and the reference voltage $V_{REF}$. Preferably, the algorithm stored in dynamic rotation element 370 is such that each time when the digital control signal has a binary value of 001, 010, or 011, the combination of the feedback capacitors coupled between terminal 376 and conductor 315 is different from the last time when the digital control signal has the same binary value. Thus, each feedback capacitor has a probability of being coupled between $V_{fb}$ and $V_{REF}$ substantially equal to that of any other feedback capacitor. Consequently, the sampling noise is minimized. In addition, the effect of any possible mismatch between feedback capacitors 342, 344, 346, and 348 is minimized within the signal bandwidth during an oversampling process that includes oversampling in the time domain.

At time $t_1$, sampling signal $\Phi_1$ switches to a low level and integrating signal $\Phi_2$ remains at the low level. Switches 321, 323, 325, 327, 329, 341, 343, 345, and 347 remain nonconductive. Switches 331, 332, 333, 334, 335, 336, 337, 338, 351, 352, 353, 354, 355, 356, and 357 are switched off, decoupling capacitors 322, 324, 326, 328, 342, 344, 346, and 348 from respective applied voltage signals, thereby terminating the sampling phase. Capacitors 322, 324, 326, 328, 342, 344, 346, and 348 are electrically isolated from each other and from applied voltage signals.

The integrating phase starts at time $t_2$ when sampling signal $\Phi_1$ remains at the low level and integrating signal $\Phi_2$ switches to a high level. Switches 331, 332, 333, 334, 335, 336, 337, 338, 351, 352, 353, 354, 355, 356, and 357 remain nonconductive. Switches 321, 323, 325, 327, 329, 341, 343, 345, and 347 are switched on and conductive. Sampling capacitors 322, 324, 326, and 328 are serially coupled between conductor 315 and the inverting input of operational amplifier 382. Likewise, feedback capacitors 342, 344, 346, and 348 are serially coupled between conductor 315 and the inverting input of operational amplifier 382. Immediately after time $t_2$, the voltage level at the noninverting input of operational amplifier 382 is determined by the voltage across serially coupled sampling capacitors 322, 324, 326, and 328 and the voltage across serially coupled feedback capacitors 342, 344, 346, and 348. The voltage across serially coupled sampling capacitors 322, 324, 326, and 328 is substantially equal to four times the voltage difference between the sampled input signal and the reference voltage at conductor 315, i.e., $4(V_{in}-V_{REF})$. The voltage across serially coupled feedback capacitors 342, 344, 346, and 348 is substantially equal to zero, $(V_{fb}-V_{REF})$, $2(V_{fb}-V_{REF})$, $3(V_{fb}-V_{REF})$, or $4(V_{fb}-V_{REF})$, depending on the binary value of the digital control signal at control terminal 374. Operational amplifier 382 drives the voltage level at its inverting input to the reference voltage level $V_{REF1}$, causing the charge stored in sampling capacitors 322, 324, 326, and 328 and feedback capacitors 342, 344, 346, and 348 to be transferred to integrating capacitor 384. The amount of charge transferred to integrating capacitor 384 is substantially equal to the average of charges stored in sampling capacitors 322, 324, 326, 328 plus the average of charges stored in feedback capacitors 342, 344, 346, and 348 before time $t_2$. Thus, the charge transferred to integrating capacitor 384 represents an average value of the four samples of the input signal modulated by the feedback signal $V_{fb}$. Therefore, switched capacitor circuit 310 performs a 4×oversampling of the input signal. It should be noted that the charges transferred to capacitor 384 are added to the charges that may already reside on capacitor 384 before time $t_2$.

At time $t_3$, sampling signal $\Phi_1$ remains at the low level and integrating signal $\Phi_2$ switches to a low level. Switches 331, 332, 333, 334, 335, 336, 337, 338, 351, 352, 353, 354, 355, 356, and 357 remain nonconductive. Switches 321, 323, 325, 327, 329, 341, 343, 345, and 347 are switched off, terminating the integrating phase and the current clock cycle. Capacitors 322, 324, 326, 328, 342, 344, 346, and 348 are electrically isolated from each other and from applied voltage signals. Switched capacitor circuit 310 is ready to sample the input signal at input terminal 312 for the next clock cycle.

As mentioned hereinbefore, switched capacitor circuit 310 performs a 4×oversampling of the input signal at input terminal 312. Switched capacitor circuit 310 uses four sampling capacitors 322, 324, 326, and 328 and four feedback capacitors 342, 344, 346, and 348 to oversample the input signal in space domain without increasing the sampling frequency. The 4×oversampling effectively reduces the sampling noise of switched capacitor circuit 310 by a factor of four.

During the sampling phase between times $t_0$ and $t_1$, the states of shunt switches 361, 363, 365, and 367 and feedback switches 362, 364, 366, and 368 are determined by the digital control signal at control terminal 374 and the dynamic rotation element 370 as described hereinbefore. Outside the time interval between times $t_0$ and $t_1$, switches 351, 353, 355, and 357 are nonconductive. Therefore, the states of switches 361, 362, 363, 364, 365, 366, 367, and 368 can have several configurations without affecting the operation of switched capacitor circuit 310. For example, in a preferred embodiment, feedback controller 360 is also controlled by sampling signal $\Phi_1$ so that switches 361, 362, 363, 364, 365, 366, 367, and 368 are all nonconductive outside the time interval between times $t_0$ and $t_1$ when sampling signal $\Phi_1$ is at a low level, as shown in FIG. 2. In an alternative embodiment, the states of switches 361, 362, 363, 364, 365, 366, 367, and 368 are configured during the integrating phase between times $t_2$ and $t_3$. The configured states remain unchanged until the beginning of the integrating phase at a subsequent clock cycle. It should be noted that, although the states of switches 361, 362, 363, 364, 365, 366, 367, and 368 can be in different configurations, a shunt switch, e.g., switch 361, and a feedback switch, e.g., switch 362, having their first current conducting electrodes connected to each other cannot be conductive simultaneously.

Figure 7:
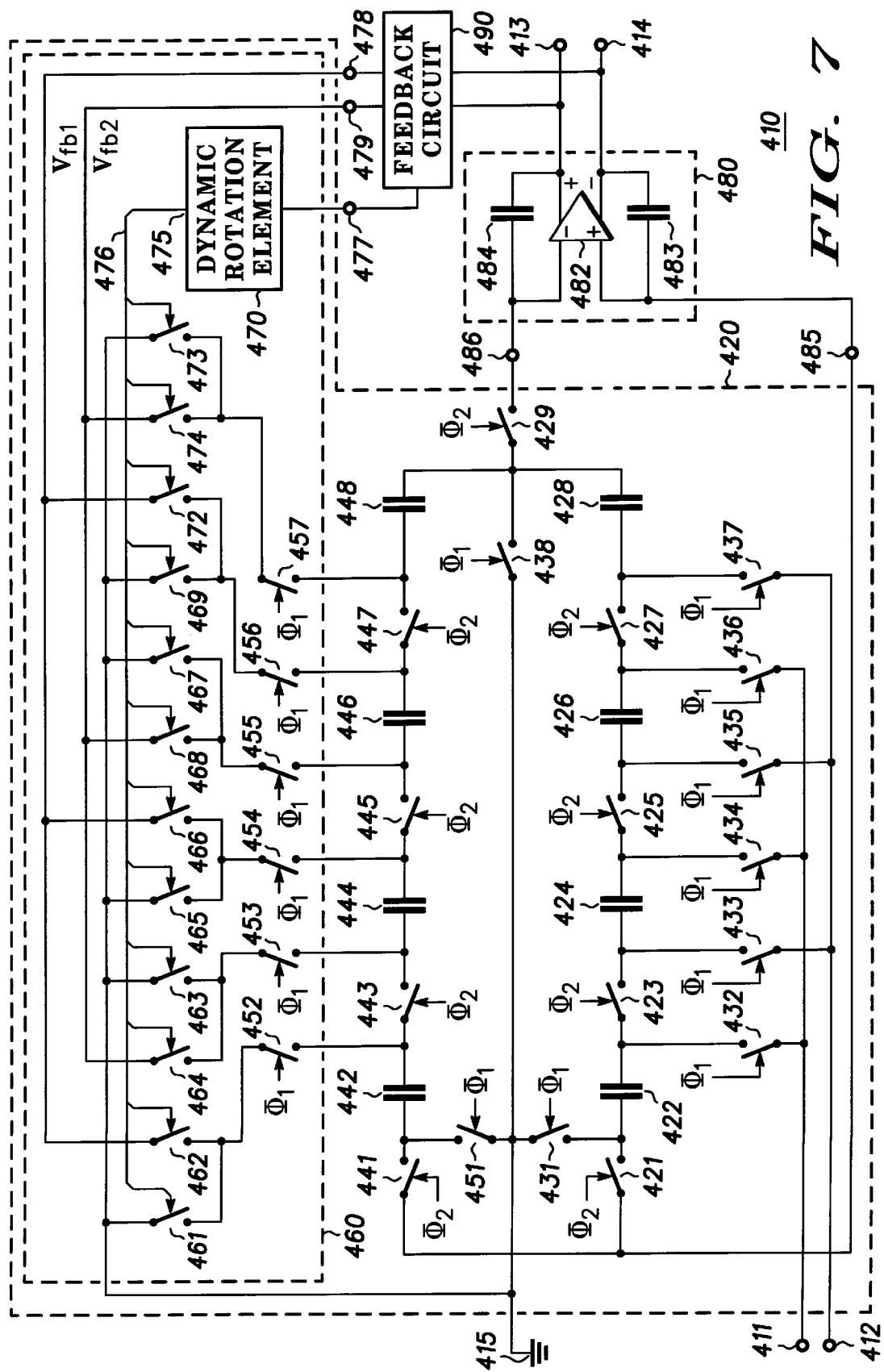

FIG. 7 is a schematic diagram of a switched capacitor circuit 410 in accordance with a sixth embodiment of the present invention. Switched capacitor circuit 410 is coupled for receiving a differential input signal via a pair of input terminals 411 and 412, and coupled for transmitting a differential output signal via a pair of output terminals 413 and 414. A reference signal such as, for example, ground voltage is supplied to switched capacitor circuit 410 via a voltage supply conductor 415. Internally, switched capacitor circuit 410 includes a sampler 420 and an integrator 480.

Sampler 420 includes sampling capacitors 422, 424, 426, and 428 and switches 421, 423, 425, 427, 429, 431, 432, 433, 434, 435, 436, 437, and 438. Preferably, the capacitance values of capacitors 422, 424, 426, and 428 are substantially equal to each other. A first electrode of capacitor 422 is coupled to a first input terminal 485 of integrator 480 via switch 421 and to conductor 415 via switch 431. A second electrode of capacitor 422 is coupled to a first electrode of capacitor 424 via switch 423 and to input terminal 411 via switch 432. The first electrode of capacitor 424 is also coupled to input terminal 412 via switch 433. A second electrode of capacitor 424 is coupled to a first electrode of capacitor 426 via switch 425 and to input terminal 411 via switch 434. The first electrode of capacitor 426 is also coupled to input terminal 412 via switch 435. A second electrode of capacitor 426 is coupled to a first electrode of capacitor 428 via switch 427 and to input terminal 411 via switch 436. The first electrode of capacitor 428 is also coupled to input terminal 412 via switch 437. A second electrode of capacitor 428 is coupled to a second input terminal 486 of integrator 480 via switch 429 and to conductor 415 via switch 438. The control electrodes of 431, 432, 433, 434, 435, 436, 437, and 438 are coupled for receiving a sampling signal $\Phi_1$. The control electrodes of switches 421, 423, 425, 427, and 429 are coupled for receiving an integrating signal $\Phi_2$.

Sampler 420 also includes feedback capacitors 442, 444, 446, and 448 and switches 441, 443, 445, 447, 451, 452, 453, 454, 455, 456, and 457. Preferably, the capacitance values of capacitors 442, 444, 446, and 448 are substantially equal to each other and to those of capacitors 422, 424, 426, and 428. Sampler 420 further includes a feedback controller 460, which includes switches 461, 462, 463, 464, 465, 466, 467, 468, 469, 472, 473, and 474 and a dynamic rotation element 470. Each of switches 461, 462, 463, 464, 465, 466, 467, 468, 469, 472, 473, and 474 has a control electrode and two current conducting electrodes. In operation, feedback controller 460 and capacitors 442, 444, 446, and 448 provide a multilevel feedback signal.

A first electrode of capacitor 442 is coupled to input terminal 485 via switch 441 and to conductor 415 via switch 451. A second electrode of capacitor 442 is coupled to a first electrode of capacitor 444 via switch 443 and to the first current conducting electrodes of switch 461 and 462 via switch 452. The first electrode of capacitor 444 is also coupled to the first current conducting electrodes of switch 463 and 464 via switch 453. A second electrode of capacitor 444 is coupled to a first electrode of capacitor 446 via switch 445 and to the first current conducting electrodes of switch 465 and 466 via switch 454. The first electrode of capacitor 446 is also coupled to the first current conducting electrodes of switch 467 and 468 via switch 455. A second electrode of capacitor 446 is coupled to a first electrode of capacitor 448 via switch 447 and to the first current conducting electrodes of switch 469 and 472 via switch 456. The first electrode of capacitor 448 is also coupled to the first current conducting electrodes of switch 473 and 474 via switch 457. A second electrode of capacitor 448 is coupled to the second electrode of capacitor 428. The control electrodes of 451, 452, 453, 454, 455, 456, and 457 are coupled for receiving sampling signal $\Phi_1$. The control electrodes of switches 441, 443, 445, and 447 are coupled for receiving integrating signal $\Phi_2$.

The control electrodes of switches 461, 462, 463, 464, 465, 466, 467, 468, 469, 472, 473, and 474 are coupled to an output port 475 of dynamic rotation element 470 via a data bus 476. An input of dynamic rotation element 470 is connected to a control terminal 477 of feedback controller 460 for receiving a control signal. The second current conducting electrodes of switches 461, 463, 465, 467, 469, and 473 are connected to conductor 415. The second current conducting electrodes of switches 462, 466, and 472 are connected to a terminal 478 of feedback controller 460 for receiving a first feedback signal $V_{fb1}$. The second current conducting electrodes of switches 464, 468, and 474 are connected to a terminal 479 of feedback controller 460 for receiving a second feedback signal $V_{fb2}$.

Devices that can be used as switches 421, 423, 425, 427, 429, 431, 432, 433, 434, 435, 436, 437, 438, 441, 443, 445, 447, 451, 452, 453, 454, 455, 456, 457, 461, 462, 463, 464, 465, 466, 467, 468, 469, 472, 473, and 474 include IGFETs, MESFETs, bipolar transistors, insulated gate bipolar transistors, and the like. Like switches 22, 24, 26, and 28 of switched capacitor circuit 10 shown in FIG. 1, switches 421, 423, 425, 427, 429, 441, 443, 445, and 447 are also referred to as integrating switches. Switches 421, 423, 425, 427, and 429 are serially coupled with capacitors 422, 424, 426, and 428 to form an arrangement of alternating integrating switches and sampling capacitors. Switches 441, 443, 445, and 447 are serially coupled with capacitors 442, 444, 446, and 448 to form an arrangement of alternating integrating switches and feedback capacitors. Like switches 33, 34, 35, 36, 37, and 38 of switched capacitor circuit 10 shown in FIG. 1, switches 431, 432, 433, 434, 435, 436, 437, 438, 451, 452, 453, 454, 455, 456, and 457 are also referred to as sampling switches. In feedback controller 460, each of switches 461, 463, 465, 467, 469, and 473 has its second current conducting electrode coupled to conductor 415 and is also referred to as a shunt switch. Each of switches 462, 466, and 472 has its second current conducting electrode coupled to feedback signal $V_{fb1}$ at terminal 478. Each of switches 464, 468, and 474 has its second current conducting electrode coupled to feedback signal $V_{fb2}$ at terminal 479. Switches 462, 464, 466, 468, 472, and 474 are also referred to as feedback switches.

Integrator 480 includes an operational amplifier 482, and integrating capacitors 483 and 484. Operational amplifier 482 has a noninverting input connected to input terminal 485 of integrator 480, and an inverting input connected to input terminal 486 of integrator 480. Operational amplifier 482 also has a noninverting output connected to output terminal 413, and an inverting output connected to output terminal 414. Capacitor 483 has one electrode connected to the noninverting input of operational amplifier 482 and another electrode connected to the inverting output of operational amplifier 482. Capacitor 484 has one electrode connected to the inverting input of operational amplifier 482 and another electrode connected to the noninverting output of operational amplifier 482.

Switched capacitor circuit 410 also includes a feedback circuit 490. Two inputs of feedback circuit 490 is are coupled to the two outputs of operational amplifier 482. A first output of feedback circuit 490 is connected to terminal 478 of feedback controller 460. A second output of feedback circuit 490 is connected to terminal 479 of feedback controller 460. Feedback circuit 490 also has a control output connected to control terminal 477 of feedback controller 460. In a preferred embodiment, feedback circuit 490 includes comparators (not shown) that generate feedback signals $V_{fb1}$ and $V_{fb2}$ at terminals 478 and 479, respectively.

Feedback circuit 490 also preferably includes a digital to analog converter (not shown) for generating a digital control signal at its control output connected to control terminal 477. Accordingly, the control output of feedback circuit 490 is also referred to as a digital control signal port.

It should be understood that the structure of switched capacitor circuit 410 is not limited to being that shown in FIG. 7. For example, switched capacitor circuit 410 is not limited to having four sampling capacitors, i.e., capacitors 422, 424, 426, and 428. In accordance with the present invention, the number of sampling capacitors in switched capacitor circuit 410 can be any number greater than one, e.g., two, three, five, six, etc. Like dynamic rotation element 370 shown in FIG. 6, dynamic rotation element 470 serves to minimize the sampling noise and the effect of mismatch between feedback capacitors 442, 444, 446, and 448 and is an optional feature in feedback controller 460.

In operation, switched capacitor circuit 410 samples the differential input signal at input terminals 411 and 412, integrates the differential input signal, and transmits the integrated signal to output terminals 413 and 414. Switched capacitor circuit 410 can operate on sampling signal $\Phi_1$ and integrating signal $\Phi_2$ shown in timing diagram 50 of FIG. 2. As mentioned hereinbefore, FIG. 2 shows one clock cycle that includes a sampling phase and an integrating phase.

The sampling phase starts at time $t_0$ when sampling signal $\Phi_1$ switches to a high level and integrating signal $\Phi_2$ is at a low level. Switches 421, 423, 425, 427, and 429 are nonconductive and capacitors 422, 424, 426, and 428 are electrically isolated from each other. Switches 431, 432, 433, 434, 435, 436, 437, and 438 are switched on and conductive. Capacitor 422 is coupled between input terminal 411 and conductor 415 via switches 432 and 431, respectively. The voltage across capacitor 422 is substantially equal to the difference between the voltage level of the first component of the input signal, e.g., $V_{in1}$, and the reference voltage level, e.g., ground voltage. Capacitor 424 is coupled between input terminals 411 and 412 via switches 434 and 433, respectively. The voltage across capacitor 424 is substantially equal to the difference between $V_{in1}$ and the voltage level of the second component of the input signal, e.g., $V_{in2}$. Capacitor 426 is coupled between input terminals 411 and 412 via switches 436 and 435, respectively. The voltage across capacitor 426 is substantially equal to the difference between $V_{in1}$ and $V_{in2}$. Capacitor 428 is coupled between conductor 415 and input terminal 412 via switches 438 and 437, respectively. The voltage across capacitor 428 is substantially equal to the difference between ground voltage and $V_{in2}$. Thus, sampling capacitor 422 samples the first component of the input signal, each of sampling capacitors 424 and 426 samples both the first and second components of the input signal, and sampling capacitor 428 samples the second component of the input signal.

Likewise, switches 441, 443, 445, and 447 are nonconductive and capacitors 442, 444, 446, and 448 are electrically isolated from each other. Switches 451, 452, 453, 454, 455, 456, and 457 are switched on and conductive. The operation of feedback controller 460 is similar to that of feedback controller 360 shown in FIG. 6. The voltage applied to each of capacitors 442, 444, 446, and 448 is determined in accordance with the digital control signal at control terminal 477 and the algorithm stored in dynamic rotation element 470. In a preferred embodiment, the voltage across capacitor 442 is either zero or $-V_{fb1}$, the voltage across capacitor 444 is either zero or $V_{fb2}-V_{fb1}$, the voltage across capacitor 446 is either zero or $V_{fb2}-V_{fb1}$, and the voltage across capacitor 448 is either zero or $V_{fb2}$.

At time $t_1$, sampling signal $\Phi_1$ switches to a low level and integrating signal $\Phi_2$ remains at the low level. Switches 421, 423, 425, 427, 429, 441, 443, 445, and 447 remain nonconductive. Switches 431, 432, 433, 434, 435, 436, 437, 438, 451, 452, 453, 454, 455, 456, and 457 are switched off, decoupling capacitors 422, 424, 426, 428, 442, 444, 446, and 448 from respective applied voltage signals, thereby terminating the sampling phase. Capacitors 422, 424, 426, 428, 442, 444, 446, and 448 are electrically isolated from each other and from applied voltage signals.

The integrating phase starts at time $t_2$ when sampling signal $\Phi_1$ remains at the low level and integrating signal $\Phi_2$ switches to a high level. Switches 431, 432, 433, 434, 435, 436, 437, 438, 451, 452, 453, 454, 455, 456, and 457 remain nonconductive. Switches 421, 423, 425, 427, 429, 441, 443, 445, and 447 are switched on and conductive. Sampling capacitors 422, 424, 426, and 428 are serially coupled between input terminals 485 and 486 of integrator 480. Likewise, feedback capacitors 442, 444, 446, and 448 are serially coupled between input terminals 485 and 486. Immediately after time $t_2$, the voltage difference between the noninverting and inverting inputs of operational amplifier 482 is determined by the total voltage across serially coupled sampling capacitors 422, 424, 426, and 428 and the total voltage across serially coupled feedback capacitors 442, 444, 446, and 448. The voltage across serially coupled sampling capacitors 422, 424, 426, and 428 is substantially equal to three times the voltage difference between the first and second components of the sampled input signal, i.e., $3(V_{in1}-V_{in2})$. The voltage across serially coupled feedback capacitors 442, 444, 446, and 448 is substantially equal to zero or linear combinations of the two feedback signals at terminals 478 and 479, depending on the binary value of the digital control signal at control terminal 477, such as, for example, $-V_{fb1}$, $V_{fb2}$, $V_{fb2}-V_{fb1}$, $V_{fb2}-2V_{fb1}$, $2V_{fb2}-V_{fb1}$, $2(V_{fb2}-V_{fb1})$, $2V_{fb2}-3V_{fb1}$, $3V_{fb2}-2V_{fb1}$, or $3(V_{fb2}-V_{fb1})$.

Operational amplifier 482 drives the voltage difference between its noninverting and inverting inputs to substantially zero, causing the charges stored in sampling capacitors 422, 424, 426, 428 and feedback capacitors 442, 444, 446, and 448 to be transferred to integrating capacitors 483 and 484. The operation of integrator 480 in the integrating phase is similar to that of integrator 90 shown in FIG. 3. Consequently, a differential output signal is generated at output terminals 413 and 414. It should be noted that the charges transferred to integrating capacitors 483 and 484 are added to the charges that may already reside on capacitors 483 and 484, respectively, before time $t_2$.

At time $t_3$, sampling signal $\Phi_1$ remains at the low level and integrating signal $\Phi_2$ switches to a low level. Switches 431, 432, 433, 434, 435, 436, 437, 438, 451, 452, 453, 454, 455, 456, and 457 remain nonconductive. Switches 421, 423, 425, 427, 429, 441, 443, 445, and 447 are switched off, terminating the integrating phase and the current clock cycle. Capacitors 422, 424, 426, 428, 442, 444, 446, and 448 are electrically isolated from each other and from applied voltage signals. Switched capacitor circuit 410 is ready to sample the input signal at input terminals 411 and 412 in a subsequent clock cycle.

Switched capacitor circuit 410 uses four sampling capacitors 422, 424, 426, and 428 and four feedback capacitors 442, 444, 446, and 448 to oversample the input signal in space domain without increasing the sampling frequency. During the integrating phase, the initial voltage across capacitors 422, 424, 426, and 428 is $3(V_{in1}-V_{in2})$. In other words, the input voltage signal is scaled by a factor of ¾. Compared with a conventional switched capacitor circuit, the signal to noise ratio of switched capacitor circuit 410 is improved by a factor of $4\times(¾)^2$, i.e., 9/4. Generally, a switched capacitor circuit having a structure similar to that of switched capacitor circuit 410 but having N sampling capacitors generally reduces the sampling noise by a factor of $(N-1)^2/N$.

During the sampling phase between times $t_0$ and $t_1$, the states of shunt switches 461, 463, 465, 467, 469, and 473 and feedback switches 462, 464, 466, 468, 472, and 474 are determined by the digital control signal at control terminal 477 and dynamic rotation element 470 as described hereinbefore. Outside the time interval between times $t_0$ and $t_1$, switches 451, 453, 455, and 457 are nonconductive. Therefore, the states of switches 461, 462, 463, 464, 465, 466, 467, 468, 469, 472, 473, and 474 can have several configurations without affecting the operation of switched capacitor circuit 410. For example, in a preferred embodiment, feedback controller 460 is also controlled by sampling signal $\Phi_1$ so that switches 461, 462, 463, 464, 465, 466, 467, 468, 469, 472, 473, and 474 are all nonconductive outside the time interval between times $t_0$ and $t_1$ when sampling signal $\Phi_1$ is at a low level, as shown in FIG. 2. It should be noted that, although the states of switches 461, 462, 463, 464, 465, 466, 467, 468, 469, 472, 473, and 474 can be in different configurations, a shunt switch, e.g., switch 461, and a feedback switch, e.g., switch 462, having their first current conducting electrodes connected to each other cannot be conductive simultaneously.

It should be understood that the scope of the present invention is not limited to the embodiments described hereinbefore with reference to FIGS. 1 and 3–7. Various modifications to the described embodiments can be made by those skilled in the art in order to achieve different circuit schematics and functions. For example, feedback circuit 390 and feedback controller 360 in switched capacitor circuit 310 shown in FIG. 6 can be modified and combined with switched capacitor circuit 110 shown in FIG. 4. Likewise, feedback circuit 490 and feedback controller 460 in switched capacitor circuit 410 shown in FIG. 7 can be modified and combined with switched capacitor circuit 210 shown in FIG. 5. Further, the oversampling in the space domain of the present invention can be used in combination with oversampling in time domain to achieve a sampling rate that is higher than that of either space domain oversampling or time domain oversampling. In addition, the switched capacitor circuit of the present invention is not limited to being used in an integrating circuit. It can also be used in other signal processing circuits such as, for example, Sigma-Delta modulator, digital to analog converter, and the like.

By now it should be appreciated that a switched capacitor circuit and a method for reducing sampling noise therein have been provided. In accordance with the present invention, the reduction of sampling noise is achieved by oversampling a signal in the space domain. Like oversampling in the time domain, oversampling in the space domain reduces the sampling noise. However, oversampling in the space domain does not increase the sampling frequency. Therefore, the switched capacitor circuit and the oversampling scheme of the present invention are power efficient and suitable for use in both low frequency and high frequency applications. For example, the switched capacitor circuit of the present invention can be used in wireless communication applications. In a wireless communication device, e.g., a digital cellular telephone, a pager, or the like, energy consumption is a major concern. By using the space domain oversampling scheme of the present invention, the battery life of a cellular telephone can be effectively increased.

What is claimed is:

1. A method for reducing sampling noise, comprising:

charging a first plurality of capacitors by applying a first voltage across each capacitor in the first plurality of capacitors having a value that is a difference between a first input signal and a reference voltage;

isolating the first plurality of capacitors from the first input signal;

charging a second plurality of capacitors by applying a second voltage across each capacitor in the second plurality of capacitors having a value that is a difference between a second input signal and the reference voltage;

isolating the second plurality of capacitors from the second input signal; and transferring the charge stored in the first plurality of capacitors to one input of an integrator and the charge stored in the second plurality of capacitors to another input of the integrator.

2. The method as claimed in claim 1, further comprising:

generating a first feedback signal from a first output signal of the integrator;

selectively charging capacitors in the second plurality of capacitors using the first feedback signal; and transferring the charge stored in the second plurality of capacitors to the integrator while transferring the charge stored in the first plurality of capacitors to the integrator.

3. The method as claimed in claim 2, wherein selectively charging capacitors in the second plurality of capacitors further includes substantially equalizing a probability that a capacitor in the second plurality of capacitors is charged.

4. The method as claimed in claim 2, further comprising generating a second feedback signal from a second output signal of the integrator, wherein the step of selectively charging capacitors in the second plurality of capacitors includes using the first feedback signal and the second feedback signal to selectively charge the capacitors in the second plurality of capacitors.

5. A switched capacitor circuit, comprising:

a first plurality of integrating switches, each integrating switch in the first plurality of integrating switches having a control electrode coupled for receiving a first clock signal, a first current conducting electrode, and a second current conducting electrode;

a first plurality of sampling capacitors serially coupled with the first plurality of integrating switches to form a first arrangement of alternating integrating switches and sampling capacitors, each sampling capacitor in the first arrangement having a first electrode coupled to the second current conducting electrode of a preceding integrating switch, and a second electrode coupled to the first current conducting electrode of a subsequent integrating switch, wherein the first current conducting electrode of a first integrating switch in the first arrangement is coupled for receiving a first reference voltage;

a first plurality of sampling switches, each sampling switch in the first plurality of sampling switches having a control electrode coupled for receiving a second clock signal, a first current conducting electrode coupled to the first electrode of a corresponding sampling capacitor in the first arrangement, and a second current conducting electrode coupled for receiving a first input signal;

a second plurality of sampling switches, each sampling switch in the second plurality of sampling switches having a control electrode coupled for receiving the second clock signal, a first current conducting electrode coupled to the second electrode of a corresponding sampling capacitor in the first arrangement, and a second current conducting electrode coupled for receiving a first reference signal; and an integrator having a first input coupled to the second current conducting electrode of a last integrating switch in the first arrangement, and a first output coupled for transmitting a first output signal.

6. The switched capacitor circuit of claim 5, wherein the integrator includes:

an operational amplifier having a first input coupled to the first input of the integrator, a second input coupled for receiving a second reference voltage, and an output coupled to the first output of the integrator; and an integrating capacitor having a first electrode coupled to the first input of the operational amplifier, and a second electrode coupled to the output of the operational amplifier.

7. The switched capacitor circuit of claim 5, further comprising:

a feedback circuit having an input coupled to the first output of the integrator, an output, and a digital control signal port;

a second plurality of integrating switches, each integrating switch in the second plurality of integrating switches having a control electrode coupled for receiving the first clock signal, a first current conducting electrode, and a second current conducting electrode;

a plurality of feedback capacitors serially coupled with the second plurality of integrating switches to form a second arrangement of alternating integrating switches and feedback capacitors, each feedback capacitor in the second arrangement having a first electrode coupled to the second current conducting electrode of a preceding integrating switch, and a second electrode coupled to the first current conducting electrode of a subsequent integrating switch, wherein the first current conducting electrode of a first integrating switch in the second arrangement is coupled for receiving the first reference voltage;

a third plurality of sampling switches, each sampling switch in the third plurality of sampling switches having a control electrode coupled for receiving the second clock signal, a first current conducting electrode coupled to the first electrode of a corresponding feedback capacitor in the arrangement, and a second current conducting electrode;

a fourth plurality of sampling switches, each sampling switch in the fourth plurality of sampling switches having a control electrode coupled for receiving the second clock signal, a first current conducting electrode coupled to the second electrode of a corresponding feedback capacitor in the second arrangement, and a second current conducting electrode coupled for receiving the first reference voltage;

a plurality of shunt switches, each shunt switch in the plurality of shunt switches having a control electrode coupled to the digital control signal port of the feedback circuit, a first current conducting electrode coupled to the second current conducting electrode of a corresponding sampling switch in the third plurality of sampling switches, and a second current conducting electrode coupled for receiving the first reference voltage; and a plurality of feedback switches, each feedback switch in the plurality of feedback switches having a control electrode coupled to the digital control signal port of the feedback circuit, a first current conducting electrode coupled to the first current conducting electrode of a corresponding shunt switch, and a second current conducting electrode coupled to the output of the feedback circuit.

8. The switched capacitor circuit of claim 7, wherein the control electrodes of the plurality of shunt switches and the control electrodes of the plurality of feedback switches are coupled to the digital control signal port of the feedback circuit via a dynamic rotation element, the dynamic rotation element having an input coupled to the digital control signal port of the feedback circuit, and an output port coupled to the control electrodes of the plurality of shunt switches and to the control electrodes of the plurality of feedback switches.

9. The switched capacitor circuit of claim 5, further comprising:

a second plurality of integrating switches, each integrating switch in the second plurality of integrating switches having a control electrode coupled for receiving the first clock signal, a first current conducting electrode, and a second current conducting electrode;

a second plurality of sampling capacitors serially coupled with the second plurality of integrating switches to form a second arrangement of alternating integrating switches and sampling capacitors, each sampling capacitor in the second arrangement having a first electrode coupled to the second current conducting electrode of a preceding integrating switch, and a second electrode coupled to the first current conducting electrode of a subsequent integrating switch, wherein the first current conducting electrode of a first integrating switch in the second arrangement is coupled for receiving the first reference voltage;

a third plurality of sampling switches, each sampling switch in the third plurality of sampling switches having a control electrode coupled for receiving the second clock signal, a first current conducting electrode coupled to the first electrode of a corresponding sampling capacitor in the second arrangement, and a second current conducting electrode coupled for receiving a second input signal;

a fourth plurality of sampling switches, each sampling switch in the fourth plurality of sampling switches having a control electrode coupled for receiving the second clock signal, a first current conducting electrode coupled to the second electrode of a corresponding sampling capacitor in the second arrangement, and a second current conducting electrode coupled for receiving a second reference signal; and wherein the integrator further has a second input coupled to the second current conducting electrode of a last integrating switch in the second arrangement, and a second output coupled for transmitting a second output signal.

10. The switched capacitor circuit of claim 9, wherein the integrator includes:

an operational amplifier having a first input coupled to the first input of the integrator, a second input coupled to the second input of the integrator, a first output coupled to the first output of the integrator, a second output coupled to the second output of the integrator;

a first integrating capacitor having a first electrode coupled to the first input of the operational amplifier, and a second electrode coupled to the first output of the operational amplifier; and a second integrating capacitor having a first electrode coupled to the second input of the operational amplifier, and a second electrode coupled to the second output of the operational amplifier.

11. A switched capacitor circuit, comprising:

a first sampling capacitor having a first electrode and a second electrode;

a second sampling capacitor having a first electrode and a second electrode;

a third sampling capacitor having a first electrode and a second electrode;

a first sampling switch having a control electrode coupled for receiving a first clock signal, a first current conducting electrode coupled to the first electrode of the first sampling capacitor, and a second current conducting electrode;

a second sampling switch having a control electrode coupled for receiving the first clock signal, a first current conducting electrode coupled to the second electrode of the first sampling capacitor, and a second current conducting electrode;

a third sampling switch having a control electrode coupled for receiving the first clock signal, a first current conducting electrode coupled to the first electrode of the second sampling capacitor, and a second current conducting electrode;

a fourth sampling switch having a control electrode coupled for receiving the first clock signal, a first current conducting electrode coupled to the second electrode of the second sampling capacitor, and a second current conducting electrode coupled to the second current conducting electrode of the second sampling switch;

a fifth sampling switch having a control electrode coupled for receiving the first clock signal, a first current conducting electrode coupled to the first electrode of the third sampling capacitor, and a second current conducting electrode coupled to the second current conducting electrodes of the third sampling switch;

a sixth sampling switch having a control electrode coupled for receiving the first clock signal, a first current conducting electrode coupled to the second electrode of the third sampling capacitor, and a second current conducting electrode coupled to the second current conducting electrode of the second sampling switch;

a first integrating switch having a control electrode coupled for receiving a second clock signal, a first current conducting electrode, and a second current conducting electrode coupled to the first electrode of the first sampling capacitor;

a second integrating switch having a control electrode coupled for receiving the second clock signal, a first current conducting electrode coupled to the second electrode of the first sampling capacitor, and a second current conducting electrode coupled to the first electrode of the second sampling capacitor;

a third integrating switch having a control electrode coupled for receiving the second clock signal, a first current conducting electrode coupled to the second electrode of the second sampling capacitor, and a second current conducting electrode coupled to the first electrode of the third sampling capacitor; and an integrator having a first input coupled to the first current conducting electrode of the first integrating switch, a first output, and a second output.

12. The switched capacitor circuit of claim 11, wherein the second current conducting electrode of the second sampling switch is coupled for receiving a first input signal, and the second current conducting electrode of the third sampling switch is coupled for receiving a second input signal.

13. The switched capacitor circuit of claim 11, further comprising a fourth integrating switch having a control electrode coupled for receiving the second clock signal, a first current conducting electrode coupled to the second electrode of the third sampling capacitor, and a second current conducting electrode, wherein the integrator further has a second input coupled to the second current conducting electrode of the fourth integrating switch.

14. The switched capacitor circuit of claim 13, further comprising:

a feedback circuit having a first input coupled to the first output of the integrator, a second input coupled to the second output of the integrator, a first output, a second output, and a digital control signal port;

a first feedback capacitor having a first electrode coupled to the first electrode of the first sampling capacitor, and a second electrode;

a second feedback capacitor having a first electrode and a second electrode;

a third feedback capacitor having a first electrode and a second electrode;

a seventh sampling switch having a control electrode coupled for receiving the first clock signal, a first current conducting electrode coupled to the second electrode of the first feedback capacitor, and a second current conducting electrode;

an eighth sampling switch having a control electrode coupled for receiving the first clock signal, a first current conducting electrode coupled to the first electrode of the second feedback capacitor, and a second current conducting electrode;

a ninth sampling switch having a control electrode coupled for receiving the first clock signal, a first current conducting electrode coupled to the second electrode of the second feedback capacitor, and a second current conducting electrode;

a tenth sampling switch having a control electrode coupled for receiving the first clock signal, a first current conducting electrode coupled to the first electrode of the third feedback capacitor, and a second current conducting electrode;

an eleventh sampling switch having a control electrode coupled for receiving the first clock signal, a first current conducting electrode coupled to the second electrode of the third feedback capacitor, and a second current conducting electrode coupled to the second current conducting electrode of the sixth sampling switch;

a first shunt switch having a control electrode coupled to the digital control signal port of the feedback circuit, a first current conducting electrode coupled to the second current conducting electrode of the seventh sampling switch, and a second current conducting electrode coupled for receiving a reference voltage;

a second shunt switch having a control electrode coupled to the digital control signal port of the feedback circuit, a first current conducting electrode coupled to the second current conducting electrode of the eighth sampling switch, and a second current conducting electrode coupled for receiving the reference voltage;

a third shunt switch having a control electrode coupled to the digital control signal port of the feedback circuit, a first current conducting electrode coupled to the second current conducting electrode of the ninth sampling switch, and a second current conducting electrode coupled for receiving the reference voltage;

a fourth shunt switch having a control electrode coupled to the digital control signal port of the feedback circuit, a first current conducting electrode coupled to the second current conducting electrode of the tenth sampling switch, and a second current conducting electrode coupled for receiving the reference voltage;

a first feedback switch having a control electrode coupled to the digital control signal port of the feedback circuit, a first current conducting electrode coupled to the first current conducting electrode of the first shunt switch, and a second current conducting electrode coupled to the first output of the feedback circuit;

a second feedback switch having a control electrode coupled to the digital control signal port of the feedback circuit, a first current conducting electrode coupled to the first current conducting electrode of the second shunt switch, and a second current conducting electrode coupled to the second output of the feedback circuit;

a third feedback switch having a control electrode coupled to the digital control signal port of the feedback circuit, a first current conducting electrode coupled to the first current conducting electrode of the third shunt switch, and a second current conducting electrode of the third shunt switch, and a second current conducting electrode coupled to the first output of the feedback circuit;

a fourth feedback switch having a control electrode coupled to the digital control signal port of the feedback circuit, a first current conducting electrode coupled to the first current conducting electrode of the fourth shunt switch, and a second current conducting electrode coupled to the second output of the feedback circuit;

a fifth integrating switch having a control electrode coupled for receiving the second clock signal, a first current conducting electrode coupled to the second electrode of the first feedback capacitor, and a second current conducting electrode coupled to the first electrode of the second feedback capacitor;

a sixth integrating switch having a control electrode coupled for receiving the second clock signal, a first current conducting electrode coupled to the second electrode of the second feedback capacitor, and a second current conducting electrode coupled to the first electrode of the third feedback capacitor; and a seventh integrating switch having a control electrode coupled for receiving the second clock signal, a first current conducting electrode coupled to the second electrode of the third feedback capacitor, and a second current conducting electrode coupled to the second current conducting electrode of the fourth integrating switch.

15. The switched capacitor circuit of claim 14, wherein the control electrodes of the first, second, third, and fourth shunt switches and the control electrodes of the first, second, third, and fourth feedback switches are coupled to the digital control signal port of the feedback circuit via a dynamic rotation element, the dynamic rotation element having an input coupled to the digital control signal port of the feedback circuit, and an output port coupled to the control electrodes of the first, second, third, and fourth shunt switches and to the control electrodes of the first, second, third, and fourth feedback switches.

16. The switched capacitor circuit of claim 11, further comprising:
- a fourth integrating switch having a control electrode coupled for receiving the second clock signal, a first current conducting electrode coupled to the second electrode of the third sampling capacitor, and a second current conducting electrode coupled to the second current conducting electrode of the first sampling switch;
- a fourth sampling capacitor having a first electrode and a second electrode;
- a fifth sampling capacitor having a first electrode and a second electrode;
- a sixth sampling capacitor having a first electrode and a second electrode;
- a seventh sampling switch having a control electrode coupled for receiving the first clock signal, a first current conducting electrode coupled to the first electrode of the fourth sampling capacitor, and a second current conducting electrode coupled to the second current conducting electrode of the first sampling switch;
- an eighth sampling switch having a control electrode coupled for receiving the first clock signal, a first current conducting electrode coupled to the second electrode of the fourth sampling capacitor, and a second current conducting electrode;
- a ninth sampling switch having a control electrode coupled for receiving the first clock signal, a first current conducting electrode coupled to the first electrode of the fifth sampling capacitor, and a second current conducting electrode;
- a tenth sampling switch having a control electrode coupled for receiving the first clock signal, a first current conducting electrode coupled to the second electrode of the fifth sampling capacitor, and a second current conducting electrode coupled to the second current conducting electrode of the eighth sampling switch;
- an eleventh sampling switch having a control electrode coupled for receiving the first clock signal, a first current conducting electrode coupled to the first electrode of the sixth sampling capacitor, and a second current conducting electrode coupled to the second current conducting electrode of the ninth sampling switch;
- a twelfth sampling switch having a control electrode coupled for receiving the first clock signal, a first current conducting electrode coupled to the second electrode of the sixth sampling capacitor, and a second current conducting electrode coupled to the second current conducting electrode of the seventh sampling switch;
- a fifth integrating switch having a control electrode coupled for receiving the second clock signal, a first current conducting electrode, and a second current conducting electrode coupled to the first electrode of the fourth sampling capacitor;
- a sixth integrating switch having a control electrode coupled for receiving the second clock signal, a first current conducting electrode coupled to the second electrode of the fourth sampling capacitor, and a second current conducting electrode coupled to the first electrode of the fifth sampling capacitor;
- a seventh integrating switch having a control electrode coupled for receiving the second clock signal, a first current conducting electrode coupled to the second electrode of the fifth sampling capacitor, and a second current conducting electrode coupled to the first electrode of the sixth sampling capacitor;
- an eighth integrating switch having a control electrode coupled for receiving the second clock signal, a first current conducting electrode coupled to the second electrode of the sixth sampling capacitor, and a second current conducting electrode coupled to the second current conducting electrode of the fourth integrating switch; and
- wherein the integrator further has a second input coupled to the first current conducting electrode of the fifth integrating switch.

17. The switched capacitor circuit of claim 16, wherein:
- the second current conducting electrode of the first sampling switch is coupled for receiving a first reference signal;
- the second current conducting electrode of the second sampling switch is coupled for receiving a first input signal;
- the second current conducting electrode of the third sampling switch is coupled for receiving a second reference signal;
- the second current conducting electrode of the eighth sampling switch is coupled for receiving a second input signal; and
- the second current conducting electrode of the ninth sampling switch is coupled for receiving a third reference signal.

18. A wireless communication device, comprising:
- a first plurality of integrating switches, each integrating switch in the first plurality of integrating switches having a control electrode coupled for receiving a first clock signal, a first current conducting electrode, and a second current conducting electrode;
- a first plurality of sampling capacitors serially coupled with the first plurality of integrating switches to form a first arrangement of alternating integrating switches and sampling capacitors, each sampling capacitor in the first arrangement having a first electrode coupled to the second current conducting electrode of a preceding integrating switch, and a second electrode coupled to the first current conducting electrode of a subsequent integrating switch, wherein the first current conducting electrode of a first integrating switch in the first arrangement is coupled for receiving a first reference voltage;
- a first plurality of sampling switches, each sampling switch in the first plurality of sampling switches having a control electrode coupled for receiving a second clock signal, a first current conducting electrode coupled to the first electrode of a corresponding sampling capacitor in the first arrangement, and a second current conducting electrode coupled for receiving a first input signal;
- a second plurality of sampling switches, each sampling switch in the second plurality of sampling switches having a control electrode coupled for receiving the second clock signal, a first current conducting electrode coupled to the second electrode of a corresponding sampling capacitor in the first arrangement, and a second current conducting electrode coupled for receiving a first reference signal; and an integrator having a first input coupled to the second current conducting electrode of a last integrating switch in the first arrangement, and a first output coupled for transmitting a first output signal.

19. A wireless communication device, comprising:

a first sampling capacitor having a first electrode and a second electrode;

a second sampling capacitor having a first electrode and a second electrode;

a third sampling capacitor having a first electrode and a second electrode;

a first sampling switch having a control electrode coupled for receiving a first clock signal, a first current conducting electrode coupled to the first electrode of the first sampling capacitor, and a second current conducting electrode;

a second sampling switch having a control electrode coupled for receiving the first clock signal, a first current conducting electrode coupled to the second electrode of the first sampling capacitor, and a second current conducting electrode;

a third sampling switch having a control electrode coupled for receiving the first clock signal, a first current conducting electrode coupled to the first electrode of the second sampling capacitor, and a second current conducting electrode;

a fourth sampling switch having a control electrode coupled for receiving the first clock signal, a first current conducting electrode coupled to the second electrode of the second sampling capacitor, and a second current conducting electrode coupled to the second current conducting electrode of the second sampling switch;

a fifth sampling switch having a control electrode coupled for receiving the first clock signal, a first current conducting electrode coupled to the first electrode of the third sampling capacitor, and a second current conducting electrode coupled to the second current conducting electrode of the third sampling switch;

a sixth sampling switch having a control electrode coupled for receiving the first clock signal, a first current conducting electrode coupled to the second electrode of the third sampling capacitor, and a second current conducting electrode coupled to the second current conducting electrode of the second sampling switch;

a first integrating switch having a control electrode coupled for receiving a second clock signal, a first current conducting electrode, and a second current conducting electrode coupled to the first electrode of the first sampling capacitor;

a second integrating switch having a control electrode coupled for receiving the second clock signal, a first current conducting electrode coupled to the second electrode of the first sampling capacitor, and a second current conducting electrode coupled to the first electrode of the second sampling capacitor;

a third integrating switch having a control electrode coupled for receiving the second clock signal, a first current conducting electrode coupled to the second electrode of the second sampling capacitor, and a second current conducting electrode coupled to the first electrode of the third sampling capacitor; and an integrator having a first input coupled to the first current conducting electrode of the first integrating switch, a first output, and a second output.

20. The wireless communication device of claim 19, further comprising a fourth integrating switch having a control electrode coupled for receiving the second clock signal, a first current conducting electrode coupled to the second electrode of the third sampling capacitor, and a second current conducting electrode, wherein the integrator further has a second input coupled to the second current conducting electrode of the fourth integrating switch.

21. The wireless communication device of claim 19, further comprising a fourth integrating switch having a control electrode coupled for receiving the second clock signal, a first current conducting electrode coupled to the second electrode of the third sampling capacitor, and a second current conducting electrode.

* * * * *